(12) United States Patent
Guilford et al.

(10) Patent No.: US 10,288,685 B2
(45) Date of Patent: May 14, 2019

(54) MULTI-BANK DIGITAL STIMULUS RESPONSE IN A SINGLE FIELD PROGRAMMABLE GATE ARRAY

(71) Applicant: Keysight Technologies, Inc., Minneapolis, MN (US)

(72) Inventors: John H. Guilford, Stanwood, WA (US); Gidget A. Cathcart, Fort Collins, CO (US); Joseph E. Mueller, Santa Clara, CA (US); Gregory A. Hill, Loveland, CO (US); Steven Joseph Narciso, Loveland, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 1146 days.

(21) Appl. No.: 14/266,243

(22) Filed: Apr. 30, 2014

(65) Prior Publication Data

US 2015/0316613 A1 Nov. 5, 2015

(51) Int. Cl.
*G01R 31/3183* (2006.01)
*G01R 31/319* (2006.01)

(52) U.S. Cl.
CPC . *G01R 31/31919* (2013.01); *G01R 31/31926* (2013.01); *G01R 31/318371* (2013.01); *G01R 31/3183* (2013.01)

(58) Field of Classification Search
CPC ...... G01R 31/31919; G01R 31/318371; G01R 31/31926; G01R 31/3183
See application file for complete search history.

(56) References Cited

U.S. PATENT DOCUMENTS

| | | | | |
|---|---|---|---|---|
| 5,790,559 A | * | 8/1998 | Sato | G01R 31/31935 714/720 |
| 2002/0044474 A1 | * | 4/2002 | Takeuchi | G11C 29/48 365/20 |
| 2010/0050029 A1 | * | 2/2010 | Kemmerling | G01R 31/318511 714/724 |
| 2010/0235135 A1 | * | 9/2010 | Conner | G01R 31/31919 702/119 |
| 2011/0282616 A1 | * | 11/2011 | Tamura | G01R 31/31907 702/117 |
| 2012/0331343 A1 | * | 12/2012 | Norton | G01R 31/318371 714/25 |

* cited by examiner

*Primary Examiner* — Kyle Vallecillo

(57) ABSTRACT

An apparatus that moves stimulus data and response data between a memory and a device under test (DUT) over a plurality of data transfer banks. In a first mode the data transfer banks output the stimulus data to the DUT as respective independent banks of serial stimulus data channels, and write the response data into the memory responsive to data provided as respective independent banks of channels of serial data from the DUT. In a second mode the data transfer banks output the stimulus data to the DUT as a single bank of combined serial stimulus data channels, and write the response data into the memory responsive to the data provided as a combined single bank of channels of serial data from the DUT.

21 Claims, 14 Drawing Sheets

MULTI-BANK DIGITAL STIMULUS RESPONSE IN A SINGLE FIELD PROGRAMMABLE GATE ARRAY

BACKGROUND

Electronic components are commonly tested over a plurality of channels, necessitating multiple banks of stimulus generation and response measurement. The testing equipment is typically constructed using more than one integrated circuit (IC) and many analog support components for each bank of channels to enable precision timing. Additionally, components such as multiple custom digital application-specific integrated circuits (ASICS), programmable delay lines and programmable clock generators are also required. The multiple ICs, analog components and various additional components, in particular the custom ASICs, require significant board space and expense. Also, alignment of timing between the banks is typically slow and difficult to maintain.

There is therefore a need to provide efficient precision timing of stimulus generation and response measurement over multiple banks with smaller design and less expense.

SUMMARY

In a representative embodiment, an apparatus for moving complex waveforms from a memory to a device under test (DUT) includes a plurality of stimulus banks, each of the stimulus banks includes a stimulus data sequencer configured to successively read waveform segments of the complex waveforms stored in the memory and write the waveform segments into a FIFO register responsive to instructions fetched from the memory; a cyclizer configured to manage the waveform segments from the FIFO register to form waveform patterns responsive to symbols embedded within the waveform segments; and an input/output (I/O) bank configured to convert the waveform patterns into serial data, and output the serial data as stimulus data, wherein the stimulus banks are configured to output the stimulus data from the I/O banks to the DUT in a first mode as respective independent banks of serial stimulus data channels, and in a second mode as a single combined bank of serial stimulus data channels.

In another representative embodiment, an apparatus for moving data generated by a device under test (DUT) responsive to stimulus data to a memory includes a plurality of response banks, each of the response banks including an I/O bank configured to deserialize the data generated by the DUT into internal data; a response data manager configured to compare the internal data from the I/O bank with expected levels of the internal data to generate comparison results, and write the comparison results and tags identifying the comparison results into a FIFO register; and a response data sequencer configured to write the comparison results and the tags from the FIFO register into the memory as response data of the DUT, responsive to instructions fetched from the memory, wherein the response banks are configured to write the response data into the memory in a first mode responsive to the data provided as respective banks of independent channels of serial data from the DUT, and in a second mode responsive to the data provided as a combined single bank of channels of serial data from the DUT.

In a still further representative embodiment, an apparatus for moving stimulus data and response data between a memory and a device under test (DUT) includes a plurality of data transfer banks, each of the data transfer banks including a stimulus data sequencer configured to successively read waveform segments of complex waveforms stored in the memory and write the waveform segments into a first FIFO register responsive to instructions fetched from the memory; a cyclizer configured to manage the waveform segments from the first FIFO register to form waveform patterns responsive to symbols embedded within the waveform segments; an input/output (I/O) bank configured to convert the waveform patterns into serial data, to output the serial data as stimulus data, and to deserialize data generated by the DUT into internal data; a response data manager configured to compare the internal data from the I/O bank with expected levels of the internal data provided from the cyclizer to generate comparison results, and write the comparison results and tags identifying the comparison results into a second FIFO register; and a response data sequencer configured to write the comparison results and the tags from the second FIFO register into the memory as response data of the DUT, responsive to instructions fetched from the memory

BRIEF DESCRIPTION OF THE DRAWINGS

The illustrative embodiments are best understood from the following detailed description when read with the accompanying drawing figures. Wherever applicable and practical, like reference numerals refer to like elements.

DETAILED DESCRIPTION

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Generally, it is understood that as used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As a further example, "substantially removed" means that one skilled in the art would consider the removal to be acceptable.

As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Figure 1:
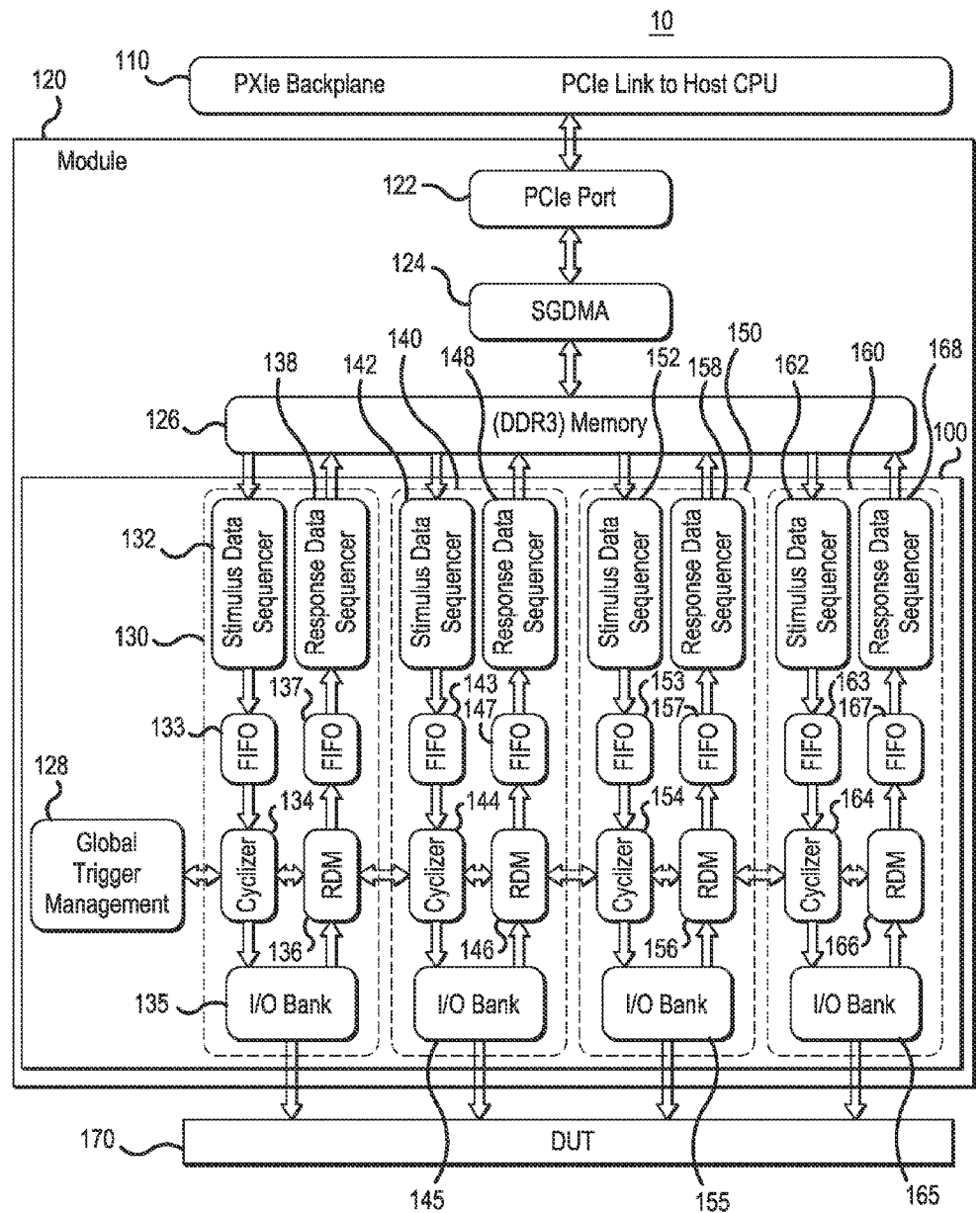
FIG. 1 is a block diagram illustrating a tester including an apparatus for moving stimulus data and response data between a memory and a device under test (DUT) over a plurality of data transfer banks, according to a representative embodiment.

FIG. 1 is a block diagram illustrating a tester 10 including an apparatus 100 for moving stimulus data and response data between a memory and a device under test (DUT) over a plurality of data transfer banks, according to a representative embodiment.

Referring to FIG. 1, in a representative embodiment, tester 10 includes module 120 which may be implemented on a circuit board such as a PXIe (PCI Express Extensions for Instrumentation) circuit board mounted in a chassis (not shown). As shown, module 120 is connectable to a device under test (DUT) 170 and may also be connectable via PXIe backplane 110 to be linked to a host CPU (not shown). DUT 170 may be an integrated circuit (IC), a printed circuit board, an electronic module, or any product having connections to electronic components. Module 120 includes memory 126 connectable to PXIe backplane 110 via PCIe (PCI Express) port 122 and scatter-gather direct memory access (SGDMA) 124. In other representative embodiments, other types of connection media and data transfer methods may be utilized between the host CPU (not shown) and memory 126. In a representative embodiment, memory 126 may be double data rate type three synchronous dynamic random access memory (DDR3 SDRAM), although other types of memories may be utilized. Memory 126 may store complex waveforms, sequencer programming instructions and waveform tables. Module 120 further includes apparatus 100 configured to move the complex waveforms from memory 126 as stimulus data to DUT 170 by reading waveform segments of the complex waveforms, and to move data generated by DUT 170 responsive to the stimulus data to memory 126 for storage as response data. The stored response data within memory 126 may be accessible via high speed data transfers between module 120 and the host CPU connectable to module 120 via PXIe backplane 110.

As also shown in FIG. 1, apparatus 100, which moves the complex waveforms and the data generated by DUT 170, includes a plurality of data transfer banks 130, 140, 150 and 160 respectively disposed between memory 126 and DUT 170. Data transfer bank 130 includes stimulus data sequencer 132, first-in-first-out (FIFO) register 133, cyclizer 134, input/output (I/O) bank 135, response data manager (RDM) 136, FIFO register 137 and response data sequencer 138. Stimulus data sequencer 132, FIFO register 133, cyclizer 134 and I/O bank 135 of data transfer bank 130 taken together may be characterized as a stimulus bank that moves the complex waveforms from memory 126 to DUT 170 as stimulus data. I/O bank 135, response data manager 136, FIFO register 137 and response data sequencer 138 of data transfer bank 130 taken together may be characterized as a response bank that moves data generated by DUT 170 responsive to stimulus data to memory 126 as response data.

Similarly, data transfer bank 140 includes stimulus data sequencer 142, FIFO register 143, cyclizer 144, I/O bank 145, response data manager 146, FIFO register 147 and response data sequencer 148. Stimulus data sequencer 142, FIFO register 143, cyclizer 144 and I/O bank 145 of data transfer bank 140 taken together may be characterized as a stimulus bank that moves the complex waveforms from memory 126 to DUT 170 as stimulus data. I/O bank 145, response data manager 146, FIFO register 147 and response data sequencer 148 of data transfer bank 140 taken together may be characterized as a response bank that moves data generated by DUT 170 responsive to stimulus data to memory 126 as response data.

Also, data transfer bank 150 includes stimulus data sequencer 152, FIFO register 153, cyclizer 154, I/O bank 155, response data manager 156, FIFO register 157 and response data sequencer 158. Stimulus data sequencer 152, FIFO register 153, cyclizer 154 and I/O bank 155 of data transfer bank 150 taken together may be characterized as a stimulus bank that moves the complex waveforms from memory 126 to DUT 170 as stimulus data. I/O bank 155, response data manager 156, FIFO register 157 and response data sequencer 158 of data transfer bank 150 taken together may be characterized as a response bank that moves data generated by DUT 170 responsive to stimulus data to memory 126 as response data.

Still further, data transfer bank 160 includes stimulus data sequencer 162, FIFO register 163, cyclizer 164, I/O bank 165, response data manager 166, FIFO register 167 and response data sequencer 168. Stimulus data sequencer 162, FIFO register 163, cyclizer 164 and I/O bank 165 of data transfer bank 160 taken together may be characterized as a stimulus bank that moves the complex waveforms from memory 126 to DUT 170 as stimulus data. I/O bank 165, response data manager 166, FIFO register 167 and response data sequencer 168 of data transfer bank 160 taken together may be characterized as a response bank that moves data generated by DUT 170 responsive to stimulus data to memory 126 as response data.

Although apparatus 100 is shown in FIG. 1 as including four data transfer banks 130, 140, 150 and 160, in other representative embodiments apparatus 100 may include any number of data transfer banks. Also, as will be described subsequently, in this representative embodiment cyclizer 134 outputs four channels of data to I/O bank 135, cyclizer 144 outputs four channels of data to I/O bank 145, cyclizer 154 outputs four channels of data to I/O bank 155, and cyclizer 164 outputs four channels of data to I/O bank 165. As such, each I/O bank 135, 145, 155 and 165 may be characterized as including four I/O channels (such as I/O channels 432, 434, 436 and 438 shown in FIG. 4) which may collectively be characterized as a bank of I/O channels. In other representative embodiments, each cyclizer may be configured to output any number of channels to its respective I/O bank.

As further shown in FIG. 1, apparatus 100 includes global trigger management 128 which monitors the status of cyclizers 134, 144, 154 and 164 within respective data transfer banks 130, 140, 150 and 160, and coordinates timing of cyclizers 134, 144, 154 and 164 responsive to external trigger conditions generated by DUT 170 for example and responsive to the monitored status of cyclizers 134, 144, 154 and 164. Global trigger management 128 controls routing of triggers, markers and events between various sources and destinations, including software trigger registers (not shown) within global trigger management 128, PXIe backplane 110, front panel connections to DUT 170 or other equipment, cyclizers 134, 144, 154 and 164, and response data managers 136, 146, 156 and 166.

In a representative embodiment, apparatus 100 and global trigger management 128 shown in FIG. 1 may be implemented by a single field programmable gate array (FPGA) disposed as part of module 120. That is, all of data transfer banks 130, 140, 150 and 160 respectively including the stimulus banks and the response banks may be constructed in a single FPGA. Apparatus 10 may thus be implemented digitally with few external analog components, providing a cost efficient, compact design with precision timing of digital stimulus generation and response measurement with up to one nanosecond on-the-fly timing resolution and delay with fast timing alignment across data transfer banks 130, 140, 150 and 160. In other representative embodiments, PCIe port 122 and SGDMA 124 may also be implemented in the FPGA.

Figure 2:
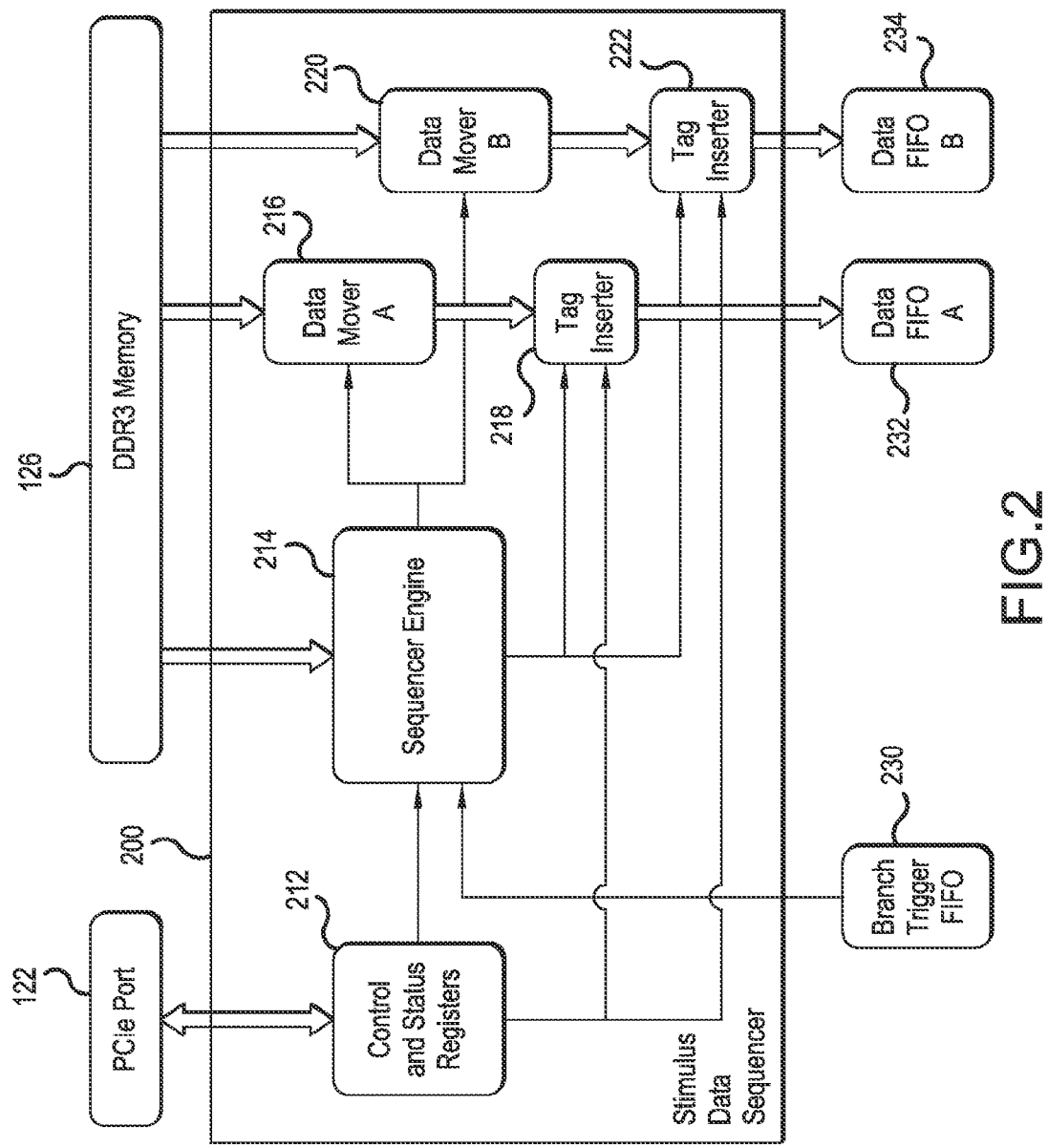
FIG. 2 is a block diagram illustrating a stimulus data sequencer of the apparatus, according to a representative embodiment.

FIG. 2 is a block diagram illustrating a stimulus data sequencer of the apparatus, according to a representative embodiment. Stimulus data sequencer 200 as shown in FIG. 2 may be representative of stimulus data sequencers 132, 142, 152 and 162 shown in FIG. 1.

Referring to FIG. 2, stimulus data sequencer 200 includes control and status registers 212 connected directly to PCIe port 122, sequencer engine 214 connected to memory 126, data mover A 216 and data mover B 220 both connected directly to memory 126, tag inserter 218 connected to data mover A 216 and data FIFO register A 232, and tag inserter 222 connected to data mover B 220 and data FIFO register B 234. Sequencer engine 214 is directly connected to branch trigger FIFO register 230.

Referring to FIG. 1, stimulus data sequencers 132, 142, 152 and 162 move data from memory 126 respectively to FIFO registers 133, 143, 153 and 163. FIFO registers 133, 143, 153 and 163 are required to smooth out data flow rate between the respective stimulus data sequencers 132, 142, 152 and 162 and cyclizers 134, 144, 154 and 164. In particular, the stimulus data sequencers 132, 142, 152 and 162 are clocked by the subsystem clock of memory 126, which is different from and asynchronous to the subsystem clock which clocks I/O banks 135, 145, 155 and 165. FIFO registers 133, 143, 153 and 163 are thus implemented between the stimulus data sequencers and the I/O banks in order to re-sync the signals and smooth over differences in data production/consumption rates. Since the data movement from memory 126 is typically bursty, FIFO registers 133, 143, 153 and 163 are implemented to have sufficient depth to prevent data starvation at the I/O banks 135, 145, 155 and 165. Although not specifically shown in FIG. 1, each of FIFO registers 133, 143, 153 and 163 respectively include FIFO registers such as branch trigger FIFO register 230, data FIFO register A 232 and data FIFO register B 234 as described with respect to FIG. 2.

At the simplest level, the mission of the stimulus data sequencers 132, 142, 152 and 162 is to keep at least one of the data FIFO register A and data FIFO register B of their respective FIFO registers 133, 143, 153 and 163 filled with data from memory 126. Sequencer engine 214 of stimulus data sequencer 200 as shown in FIG. 2 dynamically selects the waveform segments from memory 126. Sequencer engine 214 accomplishes this by successively fetching instructions from the sequencer programming stored in memory 126, interpreting the instructions, and issuing segment movement commands (data movement instructions) to data mover A 216 and data mover B 220. The segment movement commands cause data mover A 216 and data mover B 220 to successively read data words from waveform segments stored in memory 126 and to write the data words of the waveform segments into data FIFO register A 232 and data FIFO register B 234. Each waveform segment is described by a start address and a size (word count). In order to accommodate low latency event branching, sequencer engine 214 supports speculative fetching of waveform segments. Thus, stimulus data sequencer 200 as shown includes the pair of data mover A 216 and data mover B 220 that respectively fill data FIFO register A 232 and data FIFO register B 234. In a representative embodiment, at any given time, one of data mover A 216 and data mover B 220 may be moving a current active waveform segment, while the other one of data mover A 216 and data mover B 220 may be moving a speculative waveform segment (post-branch vectors) in anticipation of a branch event. Tag inserters 218 and 222 of stimulus data sequencer 200 are configured to mark each data word of a waveform segment respectively moved by data mover A 216 and data mover B 220 with a tag specified by the sequencer programming fetched from memory 126 by sequencer engine 214. The purpose of this capability is to provide a means to correlate acquired response data provided by DUT 170 with the sequencer programming.

Sequencer engine 214 of stimulus data sequencer 200 as shown in FIG. 2 translates sequencer instructions within the sequencer programming into segment movement commands. When started by a signal from control and status registers 212, sequencer engine 214 begins fetching instructions from the sequencer programming stored at a memory address specified by status and control registers 212. In a representative embodiment, a user (or host software) may write a "start" command into control and status registers 212, which in turn provides a start pulse to an input of sequencer engine 214.

Figure 3:
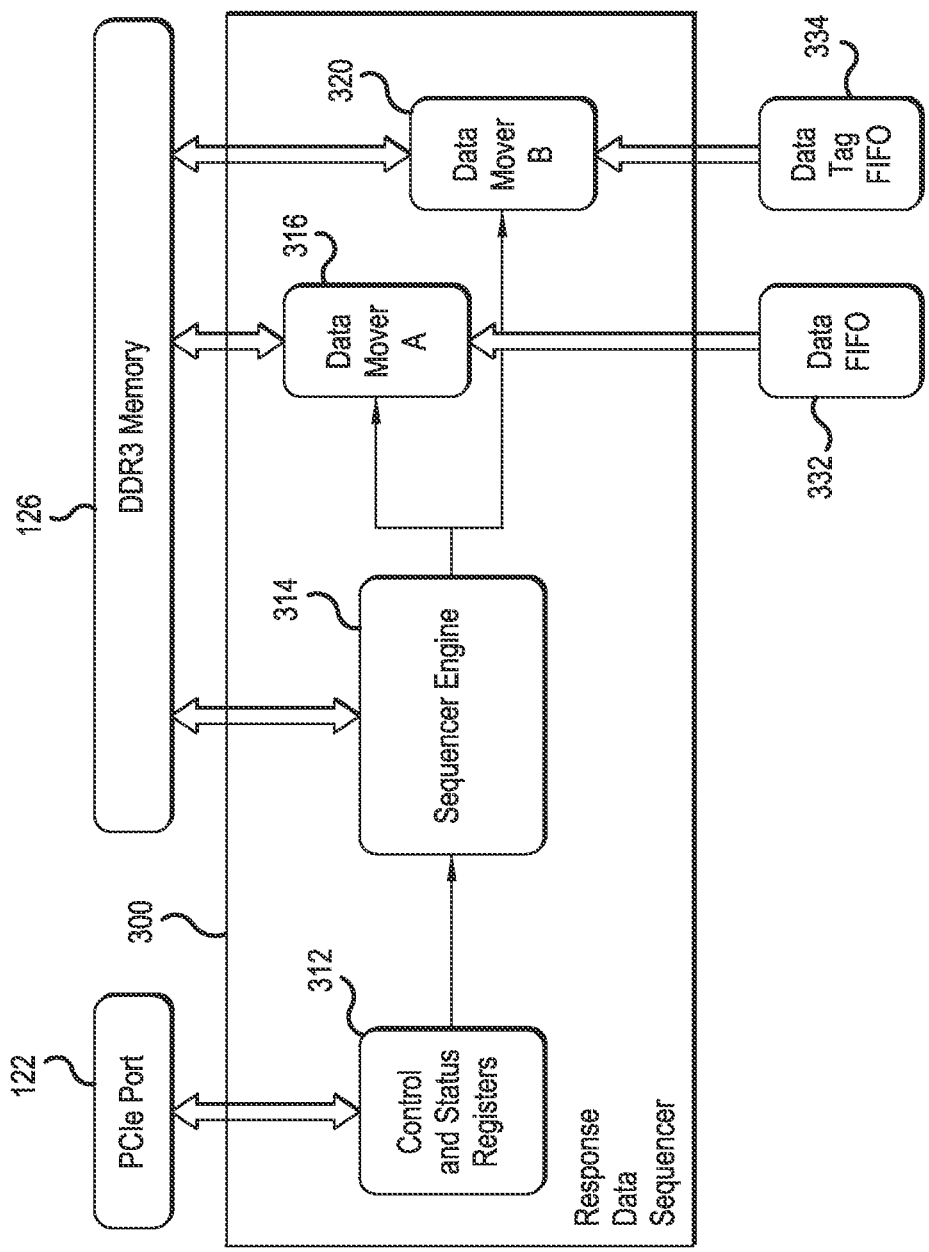
FIG. 3 is a block diagram illustrating a response data sequencer of the apparatus, according to a representative embodiment.

FIG. 3 is a block diagram illustrating a response data sequencer of the apparatus, according to a representative embodiment. Response data sequencer 300 as shown in FIG. 3 may be representative of response data sequencers 138, 148, 158 and 168 shown in FIG. 1.

Referring to FIG. 3, response data sequencer 300 includes control and status registers 312 connected directly to PCIe port 122, sequencer engine 314 connected to memory 126, and data mover A 316 and data mover B 320 both connected directly to memory 126. Data mover A 316 and data mover B 320 are also respectively connected to data FIFO register 332 and data tag FIFO register 334.

Referring to FIG. 1, response data sequencers 138, 148, 158 and 168 move data respectively from FIFO registers 137, 147, 157 and 167 to memory 126. FIFO registers 137, 147, 157 and 167 are required to smooth out data flow rate between the respective response data sequencers 138, 148, 158 and 168 and response data managers 136, 146, 156 and 166. In particular, response data sequencers 138, 148, 158 and 168 are clocked by the subsystem clock of memory 126, which is different from and asynchronous to the subsystem clock which clocks I/O banks 135, 145, 155 and 165. FIFO registers 137, 147, 157 and 167 are thus implemented between the response data sequencers and the I/O banks in order to re-sync the signals and smooth over differences in data production/consumption rates. Since the data movement to memory 126 is typically bursty, FIFO registers 137, 147, 157 and 167 are implemented to have sufficient depth to prevent data overflow at the response data managers 136, 146, 156 and 166. Although not specifically shown in FIG. 1, each of FIFO registers 137, 147, 157 and 167 respectively include FIFO registers such as data FIFO register 232 and data tag FIFO register 334 as described with respect to FIG. 3.

At the simplest level, the mission of the response data sequencers 138, 148, 158 and 168 is to keep the data FIFO register and the data tag FIFO register of their respective FIFO registers 137, 147, 157 and 167 empty by moving the data and tags within the FIFO registers to waveform segments within memory 126 as response data from DUT 170. Sequencer engine 314 of stimulus data sequencer 300 as shown in FIG. 3 accomplishes this by successively fetching instructions from the sequencer programming stored in memory 126, interpreting the instructions, and issuing segment movement commands to data mover A 316 and data mover B 320. The segment movement commands cause data mover A 316 and data mover B 320 to successively read words from data FIFO register 332 and data tag FIFO register 334 and to write the words into memory 126. Each waveform segment into which a word is written within memory 126 is described by a start address and a size (word count). Sequencer engine 314 of response data sequencer 300 functions like sequencer engine 214 of stimulus data sequencer 200 shown in FIG. 2 to translate sequencer instructions within the sequencer programming into segment movement commands. When started by a signal from control and status registers 312, sequencer engine 314 begins fetching instructions from the sequencer programming stored within memory 126 at a memory address as provided from the status and control registers 312.

The following basic instructions of the sequencer programming provide the basic capability to execute a program that moves waveform segments as stimulus data from memory 126 to the FIFO registers 133, 143, 153 and 163, and to also move response data from FIFO registers 137, 147, 157 and 167 to memory 126 via respective response data sequencers 138, 148, 158 and 168.

Read_segment (data_mover, segment_address, segment_size, last_segment_flag): This instruction causes sequencer engine 214 of stimulus data sequencer 200 as shown in FIG. 2 to program one of data mover A 216 and data mover B 220 to copy a waveform segment from memory 126 to a corresponding data FIFO register A 232 and data FIFO register B 234. The data_mover parameter specifies whether to use the active data mover or the alternate data mover. The segment_address and segment_size parameters specify the memory segment within memory 126 that contains the waveform segment to be copied. The last_segment_flag indicates whether this is the final Read_segment command in the sequencer programming.

Write_segment (data_mover, segment_address, segment_size): This instruction causes sequencer engine 314 of response data sequencer 300 as shown in FIG. 3 to program one of data mover A 316 and data mover B 320 to move a response data segment from data FIFO register 332 or a data tag segment from data tag FIFO register 334 to memory 126. The data_mover parameter specifies whether to use data mover A 316 to move a response data segment from data FIFO register 332 or data mover B 320 to move a data tag segment from data tag FIFO register 334. The segment_address and segment_size parameters specify the memory segment within memory 126 that will receive the response data segment to be copied.

Loop_segment (Loop_count): This instruction executes the subsequent read_segment or write_segment instruction Loop_count times.

Branch_immediate (sequence_address): This instruction causes the sequencer engines 214 and 314 to begin executing instructions at the memory address of memory 126 indicated by sequence_address.

Halt: This instruction causes the sequencer engines 214 and 314 to stop fetching and executing sequencer instructions of the sequencer programming.

As previously described, sequencer engine 314 of response data sequencer 300 shown in FIG. 3 functions like sequencer engine 214 of stimulus data sequencer 200 shown in FIG. 2. However, as should be understood as subsequently described, response data sequencer 300 only uses a subset of all the sequencer instructions, the subset including the Write_segment, Loop_segment, Branch_immediate and Halt instructions.

Figure 4:
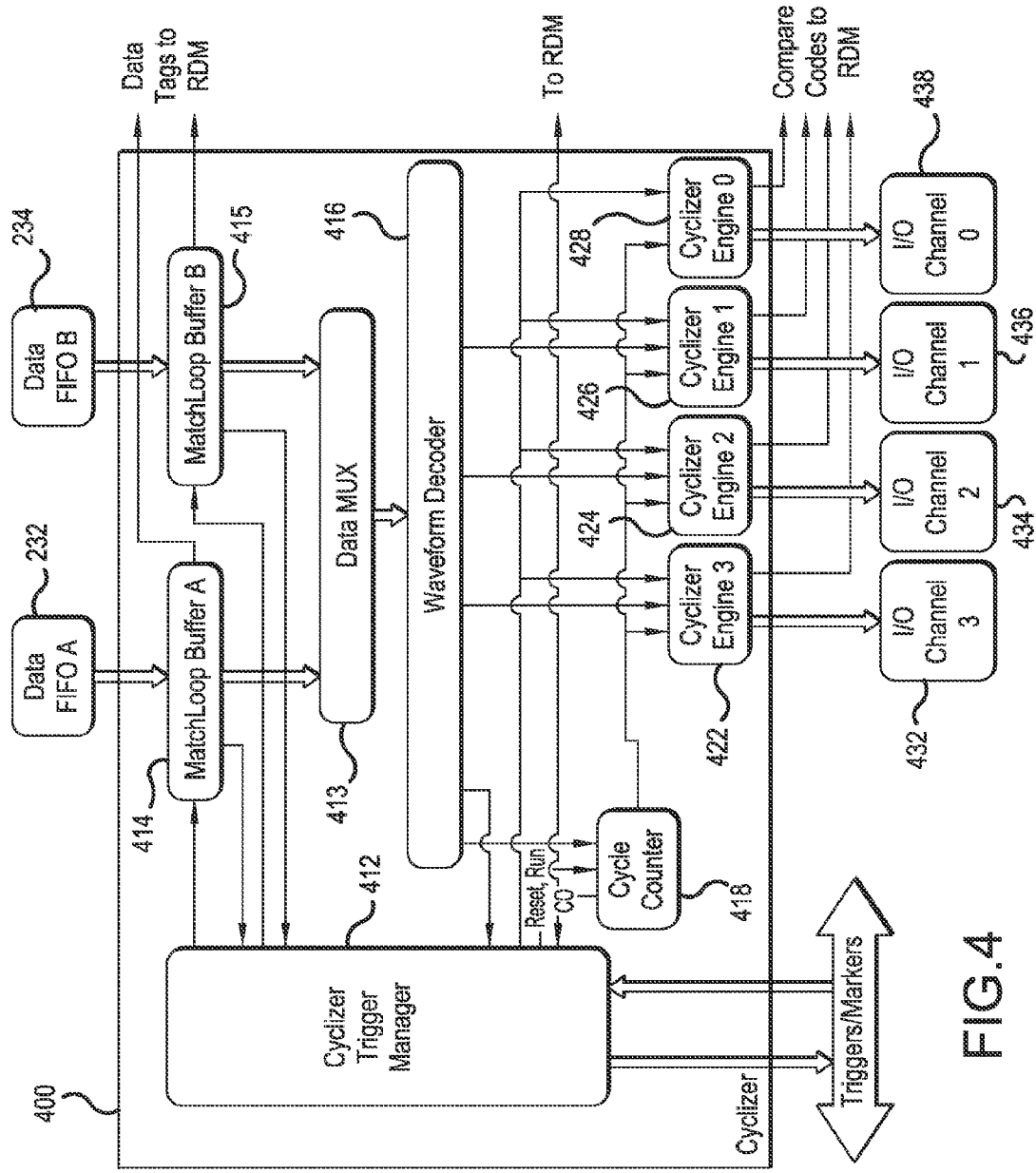
FIG. 4 is a block diagram illustrating a cyclizer of the apparatus, according to a representative embodiment.

FIG. 4 is a block diagram illustrating a cyclizer of the apparatus, according to a representative embodiment. Cyclizer 400 as shown in FIG. 4 may be representative of cyclizers 134, 144, 154 and 164 shown in FIG. 1.

Referring to FIG. 4, cyclizer 400 includes cyclizer trigger manager 412, matchloop buffer A 414, matchloop buffer B 415, data multiplexer 413, waveform decoder 416, cycle counter 418 and cyclizer engines 422, 424, 426 and 428. Cyclizer trigger manager 412 is connected to global trigger management 128 shown in FIG. 1, and receives trigger events from global trigger management 128 and correspondingly transmits other trigger events to global trigger management 128. Matchloop buffer A 414 and matchloop buffer B 415 are respectively connected to data FIFO register A 232 and data FIFO register B 234 (also shown in FIG. 2) and cyclizer trigger manager 412. Waveform decoder 416 is connected to matchloop buffer A 414 and matchloop buffer B 415 via data multiplexer 413, and is also connected to cyclizer trigger manager 412. Data multiplexer 413 outputs data from one of matchloop buffer A 414 or matchloop vector B 415 responsive to a signal (not shown) from cyclizer trigger manager 412. Cycle counter 418 is connected to cyclizer trigger manager 412 and waveform decoder 416. Cyclizer engine 3 422, cyclizer engine 2 424, cyclizer engine 1 426 and cyclizer engine 0 428 are each connected to cycle counter 418, cyclizer trigger manager 412 and waveform decoder 416. Cyclizer engine 3 422, cyclizer engine 2 424, cyclizer engine 1 426 and cyclizer engine 0 428 (which may hereinafter be referred to merely as cyclizer engines 422, 424, 426 and 428) are connected to respectively provide outputs to I/O channel 3 432, I/O channel 2 434, I/O channel 1 436 and I/O channel 0 438

(which may hereinafter be referred to merely as I/O channels 432, 434, 436 and 438). Cyclizer engines 422, 424, 426 and 428 also provide compare codes to the corresponding response data manager (see FIG. 1) to which it is connected. Although not specifically shown in FIG. 1, each of respective I/O banks 135, 145, 155 and 165 includes a set of four I/O channels such as I/O channels 432, 434, 436 and 438 as described with respect to FIG. 4 and which may collectively be characterized as a bank of I/O channels.

Cyclizers 134, 144, 154 and 164 shown in FIG. 1 are each configured to manage portions of waveform segments from respective FIFO registers 133, 143, 153 and 163 into vector loops and to branch out of the vector loops responsive to user input or sensed conditions of DUT 170 for example. In a representative embodiment, cyclizers 134, 144, 154 and 164 may be responsive to symbols embedded within the waveform segments read from memory 126. Referring to FIG. 4, cyclizer 400 manages data flow from data FIFO register A 232 and data FIFO register B 234 of a respective FIFO register based on its local sample clock and various trigger conditions, and also is responsible for decoding each data symbol into a series of bit transitions for each of its data channels or lanes as provided output to I/O channels 432, 434, 436 and 438.

In more detail, the waveform segments as read from memory 126 by stimulus data sequencer 200 as shown in FIG. 2 are in the form of symbols that provide access to waveform tables stored within waveform decoder 416 of cyclizer 400 as shown in FIG. 4. Waveform decoder 416 decodes a waveform segment received as a series of symbols into a data stream having a defined cycle length, defined transition direction, defined transition times, defined response comparisons, and defined response comparison times. As described, in a representative embodiment cyclizer 400 provides output data along four data channels or lanes to I/O channels 432, 434, 436 and 438. Accordingly, each waveform segment as read from memory 126 in this case includes a series of data words, each containing a waveform table selector and four waveform character symbols respectively corresponding to the four data channels or lanes. That is, each waveform character symbol controls the characteristics of data output to a respective data channel or lane. The collection of a waveform table selector and four waveform character symbols for each waveform segment may hereinafter be characterized as a vector. Each vector's waveform table selector symbol specifies which waveform table is to be used for interpretation of the corresponding waveform character symbols. Cyclizer 400 may thus be configured to generate and output cyclical data to its corresponding I/O bank responsive to the waveform segments. Referring to FIG. 1, the I/O banks 135, 145, 155 and 165 each output the cyclical data from its corresponding cyclizer 134, 144, 154 and 164 to DUT 170 as stimulus data. Of note, the waveform tables may be downloaded from memory 126 to waveform decoder 416 through the stimulus data sequencers and the FIFO registers during initialization. Cyclizer 400 as shown in FIG. 4 is therefore capable of supporting multiple waveform definitions and/or waveform tables.

In addition to the basic instructions as previously described, in a further representative embodiment the following instructions may be included to support Standard Test Interface Language (STIL) MatchLoops and other similar constructs including simple short counted loops. The simplest MatchLoop consists of no more than 256 vectors, all at the beginning of a waveform segment. Such a MatchLoop may be executed entirely by the cyclizer and requires no BreakPoint vectors. In a representative embodiment, the following Short_wait_loop instruction may be used to configure a segment move as a MatchLoop.

Short_wait_loop (vector_count, timeout, exit_condition): This instruction causes cyclizer 400 as shown in FIG. 4 to treat the first vector_count+1 vectors of the subsequent Read_segment instruction as a short loop. Cyclizer 400 will play the vectors until the exit condition is satisfied, then continue execution with the following vector. If cyclizer 400 executes more than timeout passes through the vector set, it will optionally indicate an error and/or halt the test with an error. The exit condition may be the occurrence of a trigger event or the successful match of all the MatchLoop vector comparisons.

In a further representative embodiment, the following instruction may be included to support data tagging.

Tag_segment (tag): This instruction causes sequencer engine 214 shown in FIG. 2 to attach the indicated tag to all vectors in the following waveform segments. This tag will become the most significant bits of the data tag that the corresponding response data manager assigns to each recorded response comparison result.

Additionally, sequencer engine 214 within stimulus data sequencer 200 shown in FIG. 2 supports counted instruction loops that can include Read_segment, Write_segment, Loop_segment, Short_wait_loop and Tag_segment instructions. Counted instruction loops may be nested up to a count of 32. In other representative embodiments, the nested count may be scaled to higher levels. The program flow control instructions which support the counted instruction loops include the following instructions.

Start_loop (Loop_count): This instruction marks the beginning of a counted loop segment. It causes the sequencer engine 214 to push its next PC (Program Counter) value onto a PC stack, push its current LC (Loop Counter) value onto an LC stack, and initialize its LC with the Loop_count value within sequencer engine 214.

End_loop: This instruction marks the end of a counted loop segment. It causes sequencer engine 214 to decrement its LC. If the new LC value is not 0, sequencer engine 214 loads its PC with the top PC stack value, causing a branch to the beginning of the loop. Otherwise, sequencer engine 214 removes the top PC stack value and pops the LC stack (moving the top LC stack value to the LC) and continues execution at the next PC.

Additionally, sequencer engine 214 within stimulus data sequencer 200 shown in FIG. 2 supports the loading of the cyclizer's waveform tables from memory. In a representative embodiment, the following Load_Table instruction may be used to configure a segment move as a waveform table load operation.

Load_Table (table_number, word_count): This instruction causes the subsequent Read_segment instruction to load one of the cyclizer's waveform tables. It loads table table_number with word_count 32-bit words.

In representative embodiments, the instruction set for sequencer engine 214 may be readily extended to include additional instructions that support more capabilities, such as longer MatchLoops, subroutines, other data dependent branching, etc.

Returning to FIG. 4, matchloop buffer 414 of cyclizer 400 consists of a 512 vector deep circular buffer along with the control logic necessary to execute the output of counted loops containing fewer than 512 vectors. Matchloop buffer 414 buffers the plurality of vectors executable in a vector loop prior to receipt of a trigger event that signals branching out of the vector loop. Matchloop buffer 414 includes logic that supports breaking out of a loop, at the end of a loop iteration, in response to a match condition input, provided that the condition input is asserted a few vectors ahead of the end of the loop iteration.

Waveform decoder 416 of cyclizer 400 as shown in FIG. 4 consists of a set of RAM blocks and supporting logic. The RAM blocks contain a set of waveform tables as previously described that define the cycle length and cycle symbol decoding for the vector words received from matchloop buffer 414. One of the RAM blocks holds the cycle length table and is addressed by the 5-bit waveform number in the vector, and outputs a 6-bit clock prescale value and an 8-bit clock divider value to cycle counter 418. Each of the other 4 RAM blocks respectively hold the waveform tables for the corresponding channels or lanes output from cyclizer engines 422, 424, 426 and 428. Each of these blocks is addressed by the 0-bit concatenation of the 5-bit waveform number and 4-bit cycle symbol of the channel or lane in the vector, and outputs 3 sets of 2-bit cycle codes paired with 8-bit transition times, that taken together describe 2 stimulus transitions and 1 response comparison for a vector cycle.

The stimulus force cycle codes output from the waveform tables within waveform decoder 416 shown in FIG. 4 to cyclizer engines 422, 424, 426 and 428 are: "U" (Logical Value 1), coded as 2'b11; "D" (Logical Value 0), coded as 2'b10; "Z" (TriState), coded as 2a'b00; and "P" (Prior State) coded as 2'b01, which are standard STIL definitions. "U" instructs a cyclizer to drive a channel output high at the indicated time, "D" instructs a cyclizer to drive a channel output low at the indicated time, "Z" instructs a cyclizer to set a channel to a high impedance state at the indicated time, and "P" instructs a cyclizer to set a channel output to its "prior" (last actively driven (U or D)) state at the indicated time. The response compare cycle codes output from the waveform tables to the cyclizer engines are: "H" (Compare High), coded as 2'b11; "L" (Compare Low), coded as 2'b00; "X" (Don't care), coded as 2'b10; and "T" (Tri-state Off) coded as 2'b01, which are also standard STIL definitions and which cause a response data manager (such as response data managers 136, 146, 156 and 166 shown in FIG. 1) to test the input levels of provided data at the indicated time against the expected levels. "H" instructs that the comparison succeeds if a channel input is at a valid high level, "L" instructs that the comparison succeeds if a channel input is at a valid low level, "Z" instructs that the comparison succeeds if a channel input is at an intermediate (neither valid high nor valid low) level, and "X" instructs that the comparison always succeeds. Waveform decoder 416 additionally supports special behavior for the cycle symbol 4'b0000. When this symbol is presented for any channel at the input of waveform decoder 416, waveform decoder 416 will not output a new output from the waveform table of the corresponding channel, but will continue to output the previous output value, causing the corresponding cyclizer engine to repeat the prior cycle. That is, in a representative embodiment the cyclizer may replay a last vector continuously at an end of a waveform pattern.

Cycle counter 418 of cyclizer 400 as shown in FIG. 4 is a subcycle counter that tracks the progress of cyclizer 400 through each vector period. Its output count and clock enable is used by cyclizer engines 422, 424, 426 and 428 to generate output transitions and compare strobes at the appropriate times. Operation of cycle counter 418 depends on input signals Prescale and Cycle Length provided from waveform decoder 416. The output count of cycle counter 418 increments from 0 to Cycle Length. When Prescale is 0, the count increments by 4 on every clock cycle. When Prescale is 1, the count increments by 2 on every clock cycle. When Prescale is 2, the count increments by 1 on every clock cycle. For larger Prescale values, the count increments by 1 every $2^{Prscale-2}$ clock cycles. Cycle counter 418 includes a clock prescaler, which produces an internal prescale count and a Clock Enable output. In a representative embodiment, the clock prescaler operates as shown in Table 1.

TABLE 1

| Prescale | Prescale Count | Next Prescale Count | Clock Enable |
|---|---|---|---|
| <3 | X | 0 | 1 |
| >2 | 0 | Prescale Count + 1 | 1 |
| >2 | != 0 | (Prescale Count + 1) MOD $2^{(Prescale - 2)}$ | 0 |

In Table 1, Prescale Count is a state variable that is used by the clock prescaler block within cycle counter 418 to control the Clock Enable output, which is in turn used by a cycle count block within cycle counter 418. It should be understood that the symbol "!=" is standard programming syntax that means "not equal to." In a representative embodiment, the behavior of cycle counter 418 depends on the Clock Enable and Prescale values, as shown in Table 2.

TABLE 2

| Clock Enable | Prescale | Count | Next Count |
|---|---|---|---|
| 0 | X | X | Count |
| 1 | 0 | Cycle Length − 3 | 0 |
| 1 | 0 | <Cycle Length − 3 | Current Count + 4 |
| 1 | 1 | Cycle Length − 1 | 0 |
| 1 | 1 | <Cycle Length − 1 | Current Count + 2 |
| 1 | >1 | Cycle Length | 0 |
| 1 | >1 | <Cycle Length | Current Count + 1 |

CO as output from cycle counter 418 as shown in FIG. 4 is a carry-out indication of the counter, and is used by other cyclizers to determine the last clock of a cycle. Reset and Run as applied to cycle counter 418 operate to start and initialize cyclizer 400 and its sub blocks.

Figure 5:
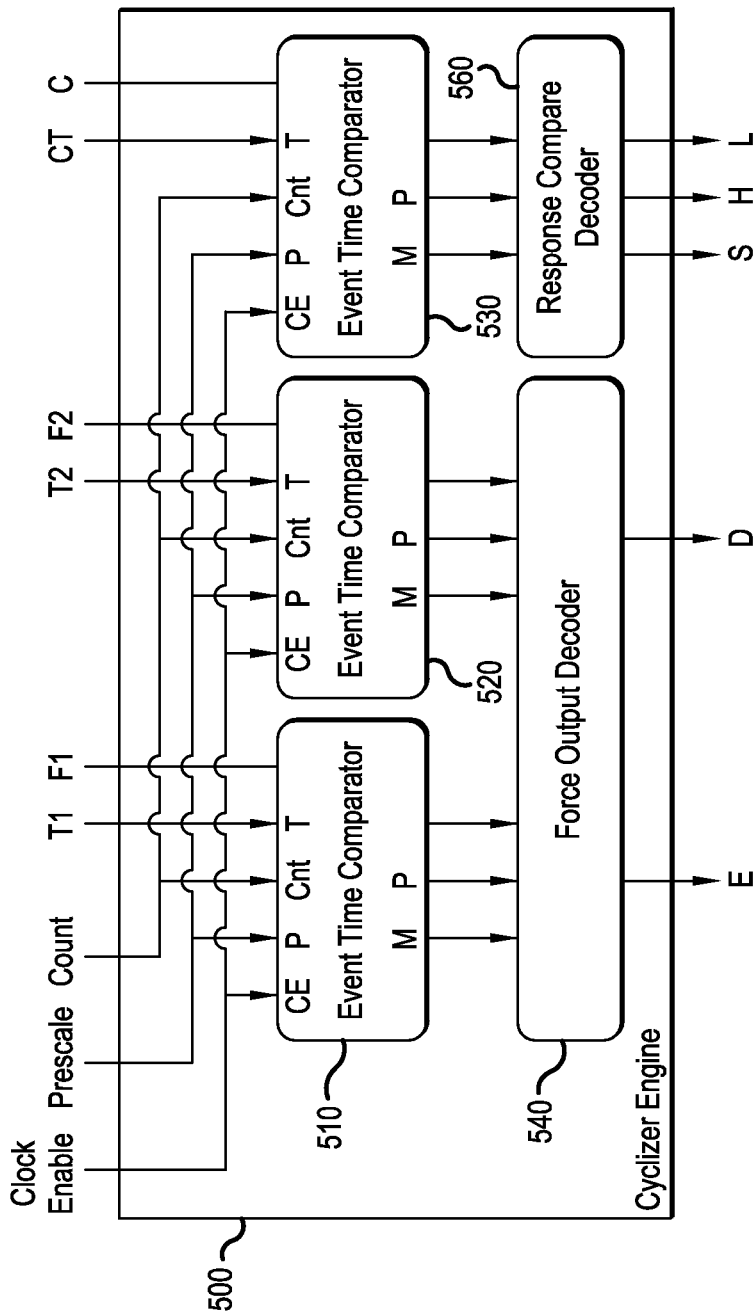
FIG. 5 is a block diagram illustrating a cyclizer engine of the apparatus, according to a representative embodiment.

FIG. 5 is a block diagram illustrating a cyclizer engine of the apparatus, according to a representative embodiment. Cyclizer engine 500 as shown in FIG. 5 may be representative of cyclizer engines 422, 424, 426 and 428 shown in FIG. 4.

Referring to FIG. 5, cyclizer engine 500 includes event time comparators 510, 520 and 530, force output decoder 540 and response compare decoder 560. Each of event time comparators 510, 520 and 530 are connected to cycle counter 418 and waveform decoder 416. Force output decoder 540 is connected to event time comparators 510 and 520. Response compare decoder 560 is connected to event time comparator 530. Cyclizer engine 500 generates five streams E, D, S, H and L of 4-bit output codes, each bit to be applied to each tick or interval of a quad data rate (QDR) I/O interval. Force codes E and D are output from force output decoder 540 to a corresponding I/O channel. Force code "E" is shorthand for "Enable", and controls the output enable signal over the 4 ticks of a QDR output cycle. Force code "D" is shorthand for "Data", and controls the output levels over the same four ticks. The enable and data QDR outputs are inputs to an external 3-state output driver device that may be disposed between apparatus 100 and DUT 170. Response compare codes S, H and L are output from response compare decoder 560 to a corresponding response data manager connected to the cyclizer. Response compare code "S" indicates a compare strobe, response compare code "H" indicates a compare high, and response compare code "L" indicates a compare low. Together these three signals define whether a response data manager should perform a comparison on a channel's input (S=1) and whether the signal level should be a valid high level (HL=11), indeterminate (HL=01), or valid low (HL=00). The Clock Enable, Prescale and Count inputs are provided from cycle counter 418. The inputs T1, F1, T2, F2, CT and C are provided from waveform decoder 416. T1 indicates the time of a first force event, and is an eight bit signal specifying on which enabled clock of the cycle the force output transition should occur. F1 is a Force code (defined previously as U, D, Z or P) for the first force event in a cycle. T2 and F2 are time and force codes for a second force event. CT is the time of the comparison event. Also, C is a comparison code (defined previously as H, L, X or T). As further shown in FIG. 5, event time comparators 510, 520 and 530 each provide outputs M and P. Output M is shorthand for Match, and when asserted indicates that the current cycle count matches one of the specified transition times "T1" or "T2". The various inputs and outputs are further defined as follows:

T1[0,7], T2[0,7]: Transition times of the 2 force events from cyclization table in the cycle decoder.
F1[1:0], F2[1:0]: Event force codes from cyclization tables in the cycle decoder.
CT[7,0]: Time of the response compare operation from cyclization tables in the cycle decoder.
C[1:0]: Compare code from cyclization tables in the cycle decoder.
M: Event time matches for current cycle count.
P[1,0]: Position of the event within the current clock cycle.
E[3,0]: Output enable signal for the 4 output ticks of the current clock cycle.
D[3,0]: Data level for the output ticks of the current clock cycle.
S[3,0]: Comparison strobe for the 4 input ticks of the current clock cycle.
H[3,0]: Comparison value for "high" input pin for the 4 input ticks of the current clock cycle.
L[3,0]: Comparison value for "low" input pin for the 4 input ticks of the current clock cycle.

Event time comparators 510, 520 and 530 as shown in FIG. 5 each compare the specified event time T with the cycle Count from cycle counter 418. Based on the prescaler value Prescale, event time comparators 510, 520 and 530 determine whether an event occurs in the current time interval, and on which output clock edge within the current time interval to assert the transition. In a representative embodiment, event time comparators 510, 520 and 530 operate synchronously with each other as shown in Table 3.

TABLE 3

| Clock Enable | Prescale | Condition | M | P |
|---|---|---|---|---|
| 0 | X | X | 0 | Don't care |
| 1 | 0 | Count[7:2] == T[7:2] | 1 | T[1:0] |
| X | 0 | Count[7:2] != T[7:2] | 0 | Don't care |
| 1 | 1 | Count[7:1] == T[7:1] | 1 | {T[0], 0} |
| X | 1 | Count[7:1] != T[7:1] | 0 | Don't care |
| 1 | >1 | Count[7:0] == T[7:0] | 1 | 2'b00 |
| X | >1 | Count[7:0] != T[7:0] | 0 | Don't care |

Force output decoder 540 of cyclizer engine 500 as shown in FIG. 5 generates a continuous stream of quad data rate output (QDR) symbols on the data output enable pin E and the data enable pin D as an output of cyclizer 400 to a corresponding I/O channel of an I/O bank. As described, each symbol is a set of 4 bits, with the least significant bit to be output by the QDR stage first. In a representative embodiment, the operation of force output decoder 540 synchronous with the force output decoders of the other cyclizer engines is shown in Table 4.

TABLE 4

| M1 | P1 | F1 | M2 | P2 | F2 | E[3:0] (Output) | D[3:0] (Output |
|---|---|---|---|---|---|---|---|
| 0 | X | X | 0 | X | X | 4{E[3]} | 4{D[3]} |
| 1 | 00 | "U" | 0 | X | X | {1,1,1,1} | {1,1,1,1} |
| 1 | 01 | "U" | 0 | X | X | {1,1,1,E[3]} | {1,1,1,D[3]} |
| 1 | 10 | "U" | 0 | X | X | {1,1,2{E[3]}} | {1,1,2{D[3]}} |
| 1 | 11 | "U" | 0 | X | X | {1,3{E[3]}} | {1,3{D[3]}} |
| 1 | 00 | "D" | 0 | X | X | {1,1,1,1} | {0,0,0,0} |
| 1 | 01 | "D" | 0 | X | X | {1,1,1,E[3]} | {0,0,0,D[3]} |
| 1 | 10 | "D" | 0 | X | X | {1,1,2{E[3]}} | {0,0,2{D[3]}} |
| 1 | 11 | "D" | 0 | X | X | {1,3{E[3]}} | {0,3{D[3]}} |
| 1 | 00 | "Z" | 0 | X | X | {0,0,0,0} | 4{D[3]} |
| 1 | 01 | "Z" | 0 | X | X | {0,0,0,E[3]} | 4{D[3]} |
| 1 | 10 | "Z" | 0 | X | X | {0,0,2{E[3]}} | 4{D[3]} |
| 1 | 11 | "Z" | 0 | X | X | {0,3{E[3]}} | 4{D[3]} |
| 1 | 00 | "P" | 0 | X | X | {1,1,1,1} | 4{D[3]} |
| 1 | 01 | "P" | 0 | X | X | {1,1,1,E[3]} | 4{D[3]} |
| 1 | 10 | "P" | 0 | X | X | {1,1,2{E[3]}} | 4{D[3]} |
| 1 | 11 | "P" | 0 | X | X | {1,3{E[3]}} | 4{D[3]} |
| 0 | X | X | 1 | 00 | "U" | {1,1,1,1} | {1,1,1,1} |
| 0 | X | X | 1 | 01 | "U" | {1,1,1,E[3]} | {1,1,1,D[3]} |
| 0 | X | X | 1 | 10 | "U" | {1,1,2{E[3]}} | {1,1,2{D[3]}} |
| 0 | X | X | 1 | 11 | "U" | {1,3{E[3]}} | {1,3{D[3]}} |
| 0 | X | X | 1 | 00 | "D" | {1,1,1,1} | {0,0,0,0} |
| 0 | X | X | 1 | 01 | "D" | {1,1,1,E[3]} | {0,0,0,D[3]} |
| 0 | X | X | 1 | 10 | "D" | {1,1,2{E[3]}} | {0,0,2{D[3]}} |
| 0 | X | X | 1 | 11 | "D" | {1,3{E[3]}} | {0,3{D[3]}} |
| 0 | X | X | 1 | 00 | "Z" | {0,0,0,0} | 4{D[3]} |
| 0 | X | X | 1 | 01 | "Z" | {0,0,0,E[3]} | 4{D[3]} |
| 0 | X | X | 1 | 10 | "Z" | {0,0,2{E[3]}} | 4{D[3]} |
| 0 | X | X | 1 | 11 | "Z" | {0,3{E[3]}} | 4{D[3]} |
| 0 | X | X | 1 | 00 | "P" | {1,1,1,1} | 4{D[3]} |
| 0 | X | X | 1 | 01 | "P" | {1,1,1,[3]} | 4{D[3]} |
| 0 | X | X | 1 | 10 | "P" | {1,1,2{E[3]}} | 4{D[3]} |
| 0 | X | X | 1 | 11 | "P" | {1,3{E[3]}} | 4{D[3]} |
| 1 | X | X | 1 | 00 | "U" | {1,1,1,1} | {1,1,1,1} |
| 1 | 00 | "U" | 1 | XX | "U" | {1,1,1,1} | {1,1,1,1} |
| 1 | X1 | X | 1 | 01 | "U" | {1,1,1,E[3]} | {1,1,1,D[3]} |
| 1 | 1X | X | 1 | 01 | "U" | {1,1,1,E[3]} | {1,1,1,D[3]} |
| 1 | 00 | "D" | 1 | 01 | "U" | {1,1,1,1} | {1,1,1,0} |
| 1 | 00 | "Z" | 1 | 01 | "U" | {1,1,1,0} | {1,1,1,D[3]} |
| 1 | 00 | "P" | 1 | 01 | "U" | {1,1,1,1} | {1,1,1,D[3]} |
| 1 | 1X | X | 1 | 10 | "U" | {1,1,2{E[3]}} | {1,1,2{D[3]} |
| 1 | 00 | "D" | 1 | 10 | "U" | {1,1,1,1} | {1,1,0,0} |
| 1 | 01 | "D" | 1 | 10 | "U" | {1,1,1,E[3]} | {1,1,0,D[3]} |
| 1 | 00 | "Z" | 1 | 10 | "U" | {1,1,0,0} | 1,1, 2{D[3]}} |
| 1 | 01 | "Z" | 1 | 10 | "U" | {1,1,0,E[3]} | 1,1, 2{D[3]}} |
| 1 | 00 | "P" | 1 | 10 | "U" | {1,1,1,1} | 1,1, 2{D[3]}} |
| 1 | 01 | "P" | 1 | 10 | "U" | {1,1,1,E[3]} | 1,1, 2{D[3]}} |
| 1 | 11 | X | 1 | 11 | "U" | {1,3{E[3]}} | {1,3{D[3]}} |
| 1 | 00 | "D" | 1 | 11 | "U" | {1,1,1,1} | {1,0,0,0} |
| 1 | 01 | "D" | 1 | 11 | "U" | {1,1,1,E[3]} | {1,0,0,D[3]} |
| 1 | 10 | "D" | 1 | 11 | "U" | {1,1,2{E[3]}} | {1,0,2{D[3]}} |
| 1 | 00 | "Z" | 1 | 11 | "U" | {1,0,0,0} | {1,3{D[3]}} |
| 1 | 01 | "Z" | 1 | 11 | "U" | {1,0,0,E[3]} | {1,3{D[3]}} |
| 1 | 10 | "Z" | 1 | 11 | "U" | {1,0,2{E[3]}} | {1,3{D[3]}} |
| 1 | 00 | "P" | 1 | 11 | "U" | {1,1,1,1} | {1,3{D[3]}} |
| 1 | 01 | "P" | 1 | 11 | "U" | {1,1,1,E[3]} | {1,3{D[3]}} |
| 1 | 10 | "P" | 1 | 11 | "U" | {1,1,2{E[3]}} | {1,3{D[3]}} |
| 1 | X | X | 1 | 00 | "D" | {1,1,1,1} | {0,0,0,0} |
| 1 | 00 | "D" | 1 | XX | "D" | {1,1,1,1} | {0,0,0,0} |
| 1 | X1 | X | 1 | 01 | "D" | {1,1,1,E[3]} | {0,0,0,D[3]} |
| 1 | 1X | X | 1 | 01 | "D" | {1,1,1,E[3]} | {0,0,0,D[3]} |
| 1 | 00 | "U" | 1 | 01 | "D" | {1,1,1,1} | {0,0,0,1} |
| 1 | 00 | "Z" | 1 | 01 | "D" | {1,1,1,0} | {0,0,0,D[3]} |
| 1 | 00 | "P" | 1 | 01 | "D" | {1,1,1,1} | {0,0,0,D[3]} |
| 1 | 1X | X | 1 | 10 | "D" | {1,1,2{E[3]}} | {0,0,2{D[3]}} |
| 1 | 00 | "U" | 1 | 10 | "D" | {1,1,1,1} | {0,0,1,1} |
| 1 | 01 | "U" | 1 | 10 | "D" | {1,1,1,E[3]} | {0,0,1,D[3]} |

TABLE 4-continued

| M1 | P1 | F1 | M2 | P2 | F2 | E[3:0] (Output) | D[3:0] (Output) |
|---|---|---|---|---|---|---|---|
| 1 | 00 | "Z" | 1 | 10 | "D" | {1,1,0,0} | {0,0, 2{D[3]}} |
| 1 | 01 | "Z" | 1 | 10 | "D" | {1,1,0,E[3]} | {0,0, 2{D[3]}} |
| 1 | 00 | "P" | 1 | 10 | "D" | {1,1,1,1} | {0,0, 2{D[3]}} |
| 1 | 01 | "P" | 1 | 10 | "D" | {1,1,1,E[3]} | {0,0, 2{D[3]}} |
| 1 | 11 | X | 1 | 10 | "D" | {1,3{E[3]}} | {0,3{D[3]}} |
| 1 | 00 | "U" | 1 | 11 | "D" | {1,1,1,1} | {0,1,1,1} |
| 1 | 01 | "U" | 1 | 11 | "D" | {1,1,1,E[3]} | {0,1,1,D[3]} |
| 1 | 10 | "U" | 1 | 11 | "D" | {1,1,2{E[3]}} | {0,1,2{D[3]}} |
| 1 | 00 | "Z" | 1 | 11 | "D" | {1,0,0,0} | {0,3{D[3]}} |
| 1 | 01 | "Z" | 1 | 11 | "D" | {1,0,0,E[3]} | {0,3{D[3]}} |
| 1 | 10 | "Z" | 1 | 11 | "D" | {1,0,2{E[3]}} | {0,3{D[3]}} |
| 1 | 00 | "P" | 1 | 11 | "D" | {1,1,1,1} | {0,3{D[3]}} |
| 1 | 01 | "P" | 1 | 11 | "D" | {1,1,1,E[3]} | {0,3{D[3]}} |
| 1 | 10 | "P" | 1 | 11 | "D" | {1,1,2{E[3]}} | {0,3{D[3]}} |
| 1 | X | X | 1 | 00 | "Z" | {0,0,0,0} | {4{D[3]}} |
| 1 | 00 | "Z" | 1 | XX | "Z" | {0,0,0,0} | {4{D[3]}} |
| 1 | X1 | X | 1 | 01 | "Z" | {0,0,0,E[3]} | {4{D[3]}} |
| 1 | 1X | X | 1 | 01 | "Z" | {0,0,0,E[3]} | {4{D[3]}} |
| 1 | 00 | "U" | 1 | 01 | "Z" | {0,0,0,1} | {1,1,1,1} |
| 1 | 00 | "D" | 1 | 01 | "Z" | {0,0,0,1} | {0,0,0,0} |
| 1 | 00 | "P" | 1 | 01 | "Z" | {0,0,0,1} | {4{D[3]}} |
| 1 | 1X | X | 1 | 10 | "Z" | {0,0,2{E[3]}} | {4{D[3]}} |
| 1 | 00 | "U" | 1 | 10 | "Z" | {0,0,1,1} | {1,1,1,1} |
| 1 | 01 | "U" | 1 | 10 | "Z" | {0,0,1,E[3]} | {1,1,1,D[3]} |
| 1 | 00 | "D" | 1 | 10 | "Z" | {0,0,1,1} | {0,0,0,0} |
| 1 | 01 | "D" | 1 | 10 | "Z" | {0,0,1,E[3]} | {0,0,0,D[3]} |
| 1 | 00 | "P" | 1 | 10 | "Z" | {0,0,1,1} | {4{D[3]}} |
| 1 | 01 | "P" | 1 | 10 | "Z" | {0,0,1,E[3]} | {4{D[3]}} |
| 1 | 11 | X | 1 | 11 | "Z" | {0,3{E[3]}} | {4{D[3]}} |
| 1 | 00 | "U" | 1 | 11 | "Z" | {0,1,1,1} | {1,1,1,1} |
| 1 | 01 | "U" | 1 | 11 | "Z" | {0,0,1,E[3]} | {1,1,1,D[3]} |
| 1 | 10 | "U" | 1 | 11 | "Z" | {0,1,2{E[3]}} | {1,1,2{D[3]}} |
| 1 | 00 | "D" | 1 | 11 | "Z" | {0,1,1,1} | {0,0,0,0} |
| 1 | 01 | "D" | 1 | 11 | "Z" | {0,0,1,E[3]} | {0,0,0,D[3]} |
| 1 | 10 | "D" | 1 | 11 | "Z" | {0,1,2{E[3]}} | {0,0,2{D[3]}} |
| 1 | 00 | "P" | 1 | 11 | "Z" | {0,1,1,1} | {4{D[3]}} |
| 1 | 01 | "P" | 1 | 11 | "Z" | {0,0,1,E[3]} | {4{D[3]}} |
| 1 | 10 | "P" | 1 | 11 | "Z" | {0,1,2{E[3]}} | {4{D[3]}} |
| 1 | X | X | 1 | 00 | "P" | {1,1,1,1} | {4{D[3]}} |
| 1 | 00 | "P" | 1 | XX | "P" | {1,1,1,1} | {4{D[3]}} |
| 1 | X1 | X | 1 | 01 | "P" | {1,1,1,E[3]} | {4{D[3]}} |
| 1 | 1X | X | 1 | 01 | "P" | {1,1,1,E[3]} | {4{D[3]}} |
| 1 | 00 | "U" | 1 | 01 | "P" | {1,1,1,1} | {1,1,1,1} |
| 1 | 00 | "D" | 1 | 01 | "P" | {1,1,1,1} | {0,0,0,0} |
| 1 | 00 | "Z" | 1 | 01 | "P" | {1,1,1,0} | {4{D[3]}} |
| 1 | 1X | X | 1 | 10 | "P" | {1,1,2{E[3]}} | {4{D[3]}} |
| 1 | 00 | "U" | 1 | 10 | "P" | {1,11,1} | {1,1,1,1} |
| 1 | 01 | "U" | 1 | 10 | "P" | {1,1,1,E[3]} | {1,1,1,D[3]} |
| 1 | 00 | "D" | 1 | 10 | "P" | {1,1,1,1} | {0,0,0,0} |
| 1 | 01 | "D" | 1 | 10 | "P" | {1,1,1,E[3]} | {0,0,0,D[3]} |
| 1 | 00 | "Z" | 1 | 10 | "P" | {1,1,0,0} | {4{D[3]}} |
| 1 | 01 | "Z" | 1 | 10 | "P" | {1,1,0,E[3]} | {4{D[3]}} |
| 1 | 11 | X | 1 | 11 | "P" | {0,3{E[3]}} | {4{D[3]}} |
| 1 | 00 | "U" | 1 | 11 | "P" | {1,1,1,1} | {1,1,1,1} |
| 1 | 01 | "U" | 1 | 11 | "P" | {1,1,1,E[3]} | {1,1,1,D[3]} |
| 1 | 00 | "U" | 1 | 11 | "P" | {1,1,2{E[3]}} | {1,1,2{D[3]}} |
| 1 | 00 | "D" | 1 | 11 | "P" | {1,1,1,1} | {0,0,0,0} |
| 1 | 01 | "D" | 1 | 11 | "P" | {1,1,1,E[3]} | {0,0,0,D[3]} |
| I | 10 | "D" | 1 | 11 | "P" | {1,1,2{E[3]}} | {0,0,2{D[3]}} |
| 1 | 00 | "Z" | 1 | 11 | "P" | {1,0,0,0} | {4{D[3]}} |
| 1 | 01 | "Z" | 1 | 11 | "P" | {1,0,0,E[3]} | {4{D[3]}} |
| 1 | 10 | "Z" | 1 | 11 | "P" | {1,0,2{E[3]}} | {4{D[3]}} |

Figure 7:
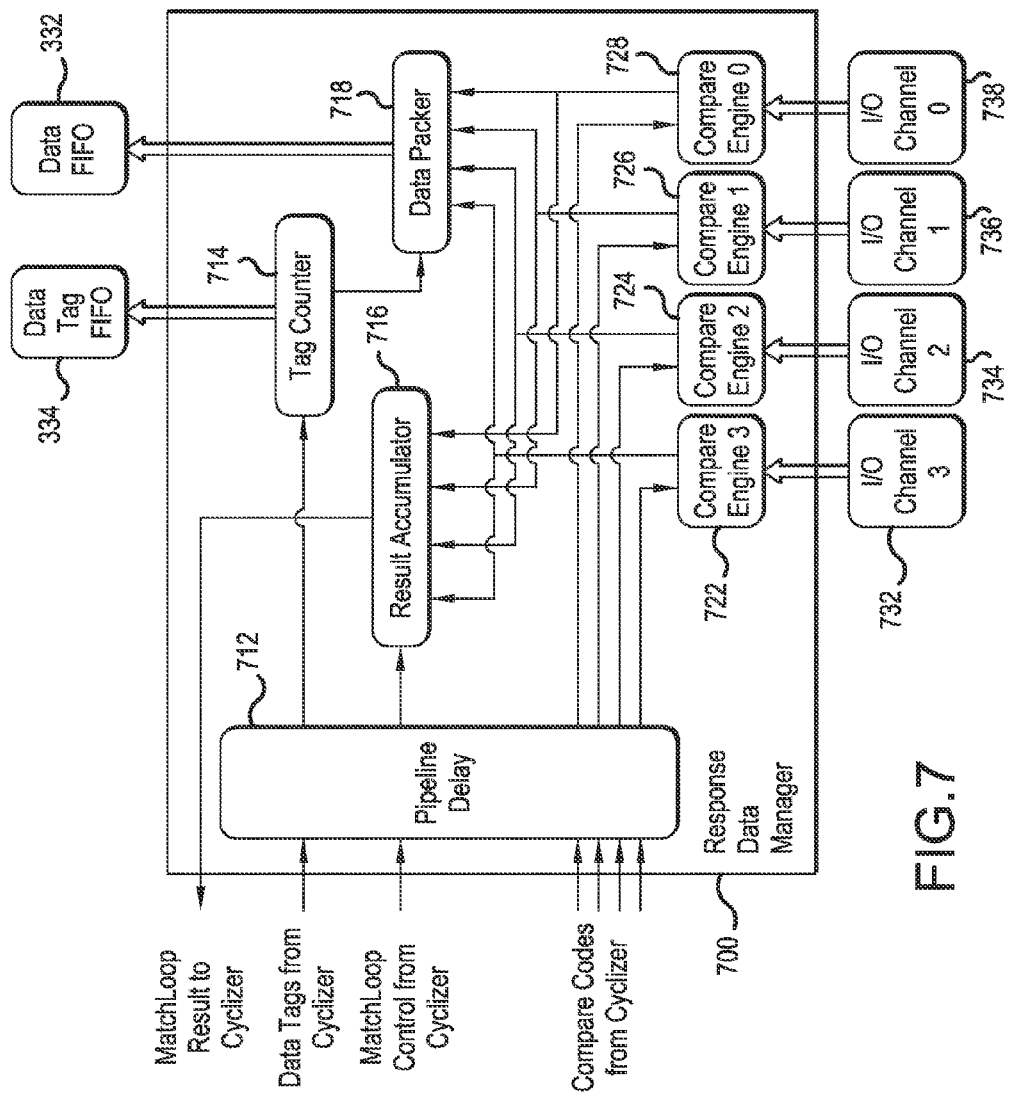
FIG. 7 is a block diagram illustrating a response data manager of the apparatus, according to a representative embodiment.

Response compare decoder 560 of cyclizer engine 500 as shown in FIG. 5 generates and outputs a continuous stream of quad data rate (QDR) symbols S, H and L for a channel to a corresponding compare engine 722, 724, 726 or 728 of a response data manager such as response data manager 700 shown in FIG. 7 connected to the cyclizer. Each symbol is a sequence of 4 bits, with the least significant bit used in the comparison of the first QDR input bit in the corresponding clock cycle. In a representative embodiment, synchronous operation of response compare decoder 560 with the response compare decoders of the other cyclizer engines is shown in Table 5.

TABLE 5

| M | P | C | S[3:0] (Output) | H[3:0] (Output) | L[3:0] (Output) |
|---|---|---|---|---|---|
| 0 | X | X | {0, 0, 0, 0} | Don't Care | Don't Care |
| 1 | 00 | "H" | {0, 0, 0, 1} | {1, 1, 1, 1} | {1, 1, 1, 1} |
| 1 | 01 | "H" | {0, 0, 1, 0} | {1, 1, 1, 1} | {1, 1, 1, 1} |
| 1 | 10 | "H" | {0, 1, 0, 0} | {1, 1, 1, 1} | {1, 1, 1, 1} |
| 1 | 11 | "H" | {1, 0, 0, 0} | {1, 1, 1, 1} | {1, 1, 1, 1} |
| 1 | 00 | "L" | {0, 0, 0, 1} | {0, 0, 0, 0} | {0, 0, 0, 0} |
| 1 | 01 | "L" | {0, 0, 1, 0} | {0, 0, 0, 0} | {0, 0, 0, 0} |
| 1 | 10 | "L" | {0, 1, 0, 0} | {0, 0, 0, 0} | {0, 0, 0, 0} |
| 1 | 11 | "L" | {1, 0, 0, 0} | {0, 0, 0, 0} | {0, 0, 0, 0} |
| X | X | "X" | {0, 0, 0, 0} | Don't Care | Don't Care |
| 1 | 00 | "T" | {0, 0, 0, 1} | {0, 0, 0, 0} | {1, 1, 1, 1} |
| 1 | 01 | "T" | {0, 0, 1, 0} | {0, 0, 0, 0} | {1, 1, 1, 1} |
| 1 | 10 | "T" | {0, 1, 0, 0} | {0, 0, 0, 0} | {1, 1, 1, 1} |
| 1 | 11 | "T" | {1, 0, 0, 0} | {0, 0, 0, 0} | {1, 1, 1, 1} |

Figure 9:
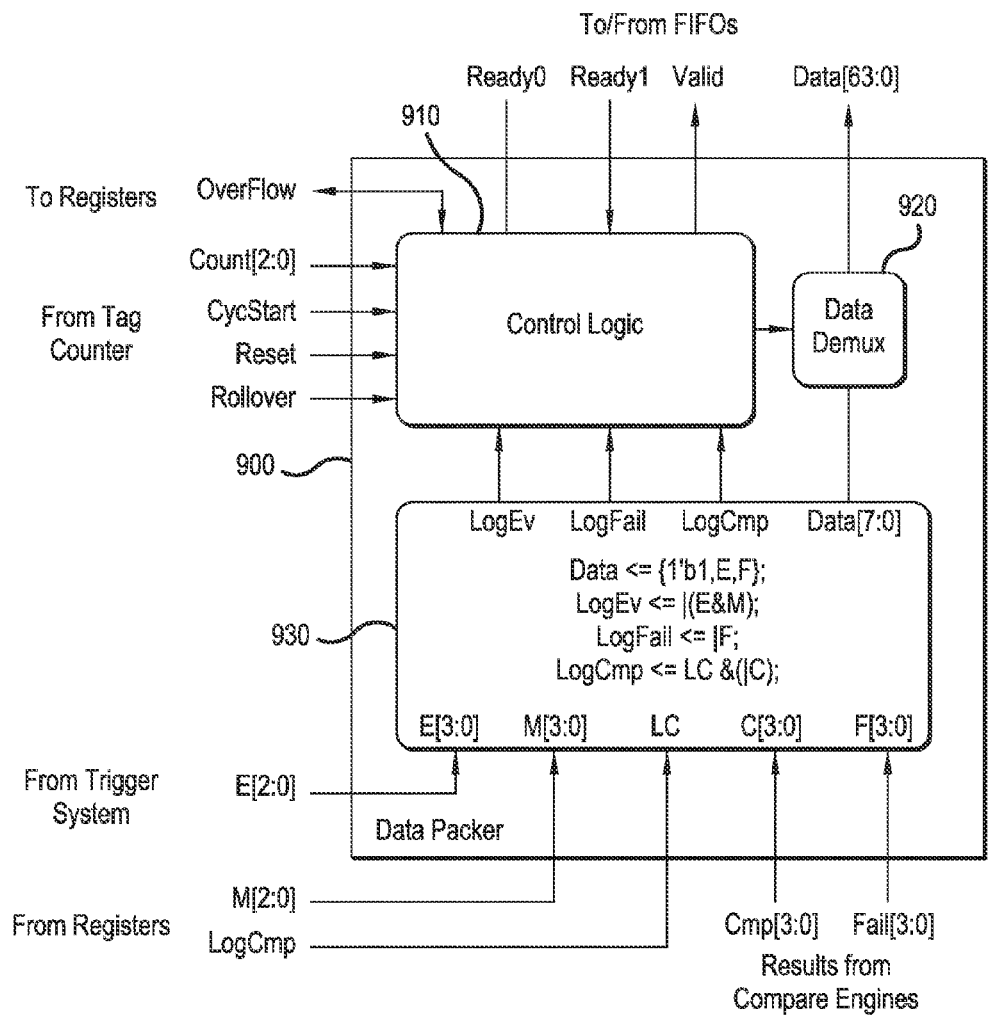
FIG. 9 is a block diagram illustrating a data packer of a response data manager of the apparatus, according to a representative embodiment.

Returning to FIG. 4, cyclizer trigger manager 412 of cyclizer 400 controls the operational state of cyclizer 400 based on the values of various control register (not shown) within cyclizer 400 and trigger signals from global trigger management 128. In a representative embodiment, cyclizer trigger manager 412 may also generate marker events. Marker events are flags that a data response manager such as response data managers 136, 146, 156 and 166 shown in FIG. 1 include in data that will be written into memory 126 in order to indicate when some internal or external condition was detected relative to a data stream. These marker events are shown in FIG. 9 as Events[2:0] provided from the cyclizer trigger manager 412 shown in FIG. 4.

Figure 6A:
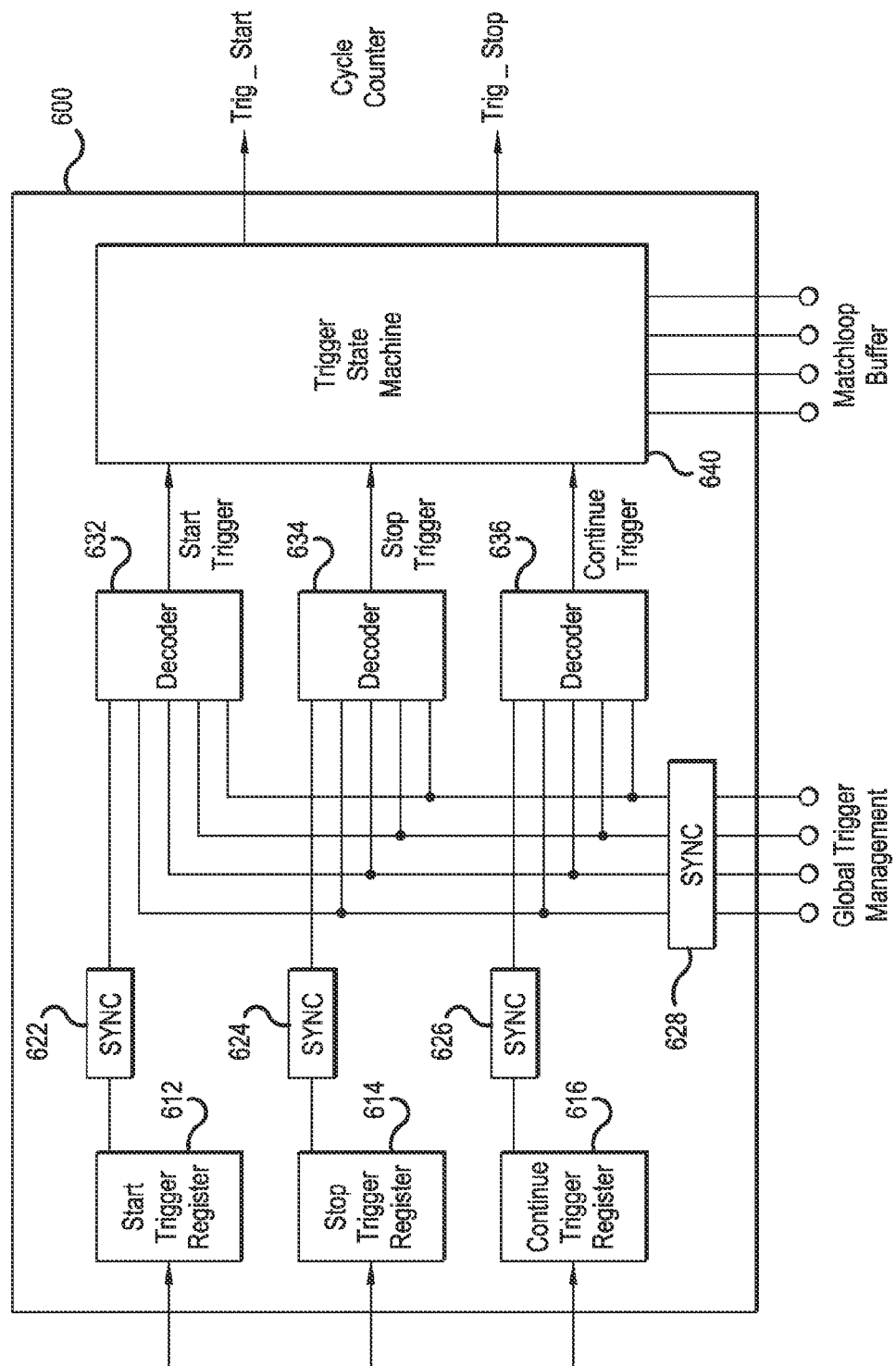
FIG. 6A is a block diagram illustrating a cyclizer trigger manager of a cyclizer, according to a representative embodiment.

FIG. 6A is a block diagram illustrating a cyclizer trigger manager of a cyclizer, according to a representative embodiment. Cyclizer trigger manager 600 as shown in FIG. 6A may correspond to cyclizer trigger manager 412 shown in FIG. 4. Cyclizer trigger manager 600 generates and controls routing of trigger events within the cyclizer, as will be subsequently described.

Referring to FIG. 6A, in a representative embodiment cyclizer trigger manager 600 includes START trigger register 612, STOP trigger register 614 and CONTINUE trigger register 616. The START trigger register 612, STOP trigger register 614 and CONTINUE trigger register 616 are 5-bit registers which respectively receive 5-bit codes from read/write configuration registers within the host provided via PCIe port 122 read and write operations through a software programming tool used by an end user, and which are used to decode the trigger sources assigned to the Start/Stop and Continue operation conditions. These codes define corresponding conditions or events that will be accepted as the trigger conditions for START, STOP, and CONTINUE. START trigger register 612, STOP trigger register 614 and CONTINUE trigger register 616 hold the codes until reset by the host, and subsequently output the codes respectively to synchronizers 622, 624 and 626 which synchronizer the codes representative of events to the appropriate clock domain within the cyclizer. The synchronized codes are subsequently output from synchronizers 622, 624 and 626 to decoders 632, 634 and 636. As further shown in FIG. 6A, synchronizer 628 receives software (SW) triggers, backplane triggers, front panel (FP) triggers and channel (CH) triggers from global trigger management 128 shown in FIG. 1. The SW triggers, backplane triggers, FP triggers and CH triggers are synchronized to the appropriate clock domain within the cyclizer by synchronizer 628. Decoders 632, 634 and 636 respectively decode the outputs of synchronizers 622, 624 and 626, and responsive to the SW triggers, backplane triggers, FP triggers and CH triggers output from synchronizer 628 generate and output START, STOP, and CONTINUE triggers to trigger state machine 640. As further shown in FIG. 6A, trigger state machine 640 is responsive to Sequence Completed, Start Sequencer, FIFO ready (FIFO_RDY) true and Pattern Match Fail signals provided from matchloop buffer 414 shown in FIG. 4, and further responsive to the START, STOP, and CONTINUE triggers from decoders 632, 634 and 636, to generate and output Trig_Start and Trig_Stop signals to cycle counter 418 shown in FIG. 4. Matchloop buffer 414 provides the Sequence Completed, Start Sequencer, FIFO ready (FIFO_RDY) true and Pattern Match Fail signals responsive to sequencer programming within memory 126.

Figure 6B:
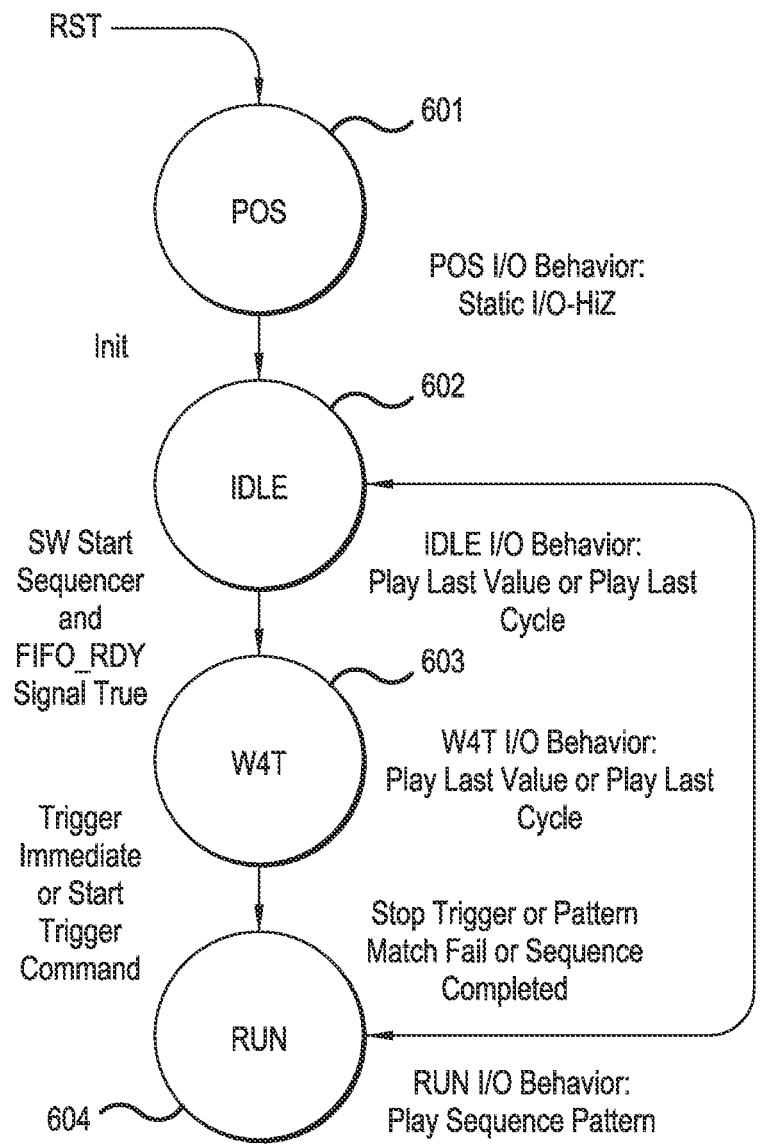
FIG. 6B is a flow diagram illustrating a cyclizer trigger state machine of the cyclizer trigger manager, according to a representative embodiment.

FIG. 6B is a flow diagram illustrating a cyclizer trigger state machine of the cyclizer trigger manager, according to a representative embodiment. In particular, FIG. 6B illustrates operational states of trigger state machine 640 shown in FIG. 6A. As shown in FIG. 6B, trigger state machine 640 enters a power on state (POS) state 601 which is a Static I/O—high impedance state responsive to a reset (RST) signal issued from the host. After initialization (Init) is complete, trigger state machine 640 enters an IDLE state 602 and waits for the Start Sequencer signal and the FIFO_RDY signal from matchloop buffer 414 to be true. When true, trigger state machine 640 enters the wait for trigger (W4T) state 603. Upon receipt of a Start trigger, trigger state machine 640 enters the run (RUN) state 604 and outputs the start signal to cycle counter 418, and the cyclizer then plays a sequence of vectors known as a pattern. Trigger state machine 640 exits the RUN state to the IDLE state when a Stop trigger occurs, or when a Pattern Match Fail signal or Sequence Completed signal is true. Upon re-entering the IDLE state 602 from the RUN state 604, trigger state machine 640 outputs the Trig_Stop signal to cyclizer 400, and cyclizer 400 will subsequently either play the last vector value or play the last vector cycle. This behavior after a pattern (sequence of vectors) has been completed or stopped is preconfigured and programmed during the sequencer programming stage.

Figure 6C:
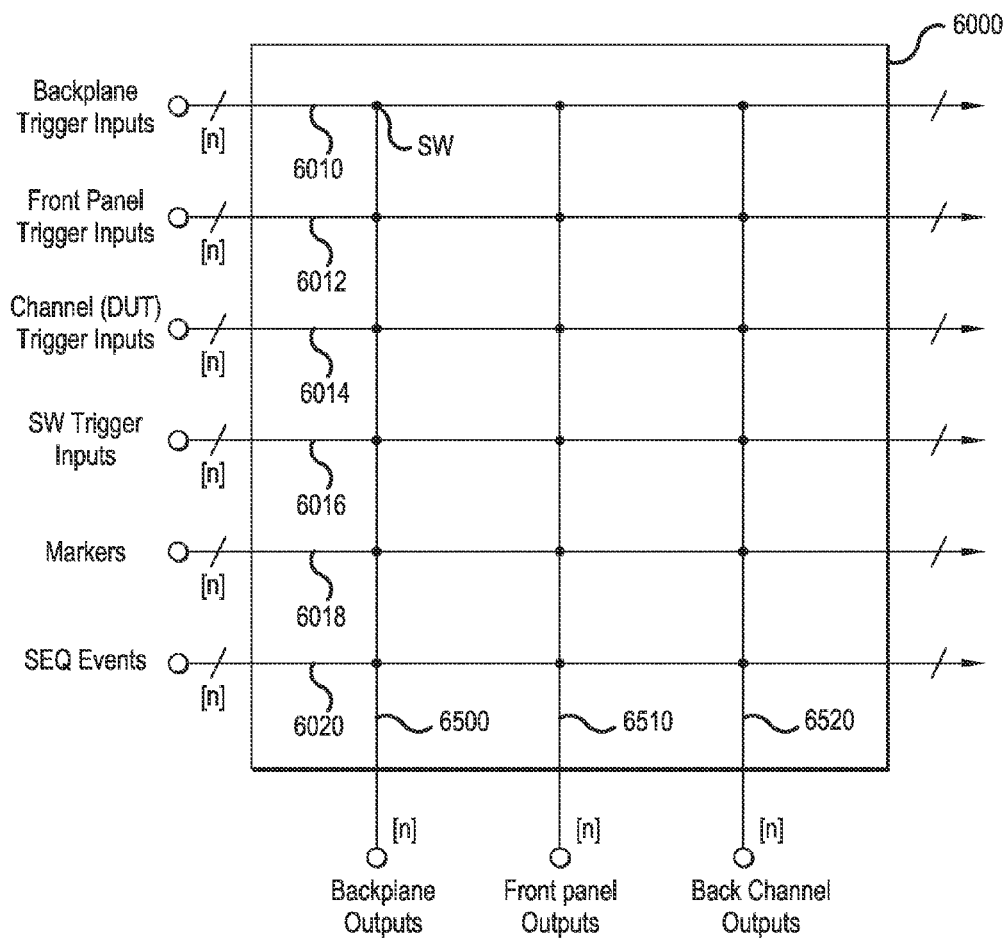
FIG. 6C is a diagram illustrating a routing matrix within a global trigger management, according to a representative embodiment.

FIG. 6C is a diagram illustrating a routing matrix within global trigger management, according to a representative embodiment. Routing matrix 6000 as shown in FIG. 6C may be representative of a switching component within global trigger management 128 shown in FIG. 1.

Referring to FIG. 6C, in a representative embodiment routing matrix 6000 includes input lines 6010, 6012, 6014, 6016, 6018 and 6020 respectively connected to receive the backplane trigger, the FP trigger, the CH trigger, the SW trigger, markers and SEQ events from the program sequence state status controlled by the sequencer programming stage. The input lines are further connected to the cyclizers 134, 144, 154 and 164 as shown in FIG. 1. As also shown in FIG. 6C, routing matrix 6000 further includes output lines 6500, 6510 and 6520 that respectively provide the triggers, markers and sequencer events as outputs to the backplane PXIe backplane 110 in FIG. 1, the front panel of apparatus 10 and bank channels. Respective switches (not shown) are disposed at each of the nodes SW to correspondingly route the triggers, markers and sequencer events to the output lines 6500, 6510 and 6520, and also further along the respective input lines 6010, 6012, 6014 and 6016 to the cyclizer trigger manager within the corresponding cyclizer, responsive to trigger input sources.

FIG. 7 is a block diagram illustrating a response data manager of the apparatus, according to a representative embodiment. Response data manager 700 as shown in FIG. 7 may be representative of response data managers 136, 146, 156 and 166 shown in FIG. 1.

Referring to FIG. 7, response data manager 700 includes pipeline delay 712, tag counter 714, result accumulator 716 and data packer 718. As shown, pipeline delay 712 is connected to a cyclizer such as cyclizer 400 shown in FIG. 4. Tag counter 714 is connected to pipeline delay 712 and data tag FIFO register 334 (see FIG. 3). Data packer 718 is connected to data FIFO register 332 (see FIG. 3). Result accumulator 716 is connected to pipeline delay 712 and a cyclizer such as cyclizer 400. Response data manager 700 also includes compare engine 3 722, compare engine 2 724, compare engine 1 726 and compare engine 0 728 each connected to result accumulator 716, data packer 718 and pipeline delay 712. Compare engine 3 722, compare engine 2 724, compare engine 1 726 and compare engine 0 728 (which may hereinafter be referred to merely as compare engines 722, 724, 726 and 728) are connected to respectively receive outputs from I/O channel 3 732, I/O channel 2 734, I/O channel 1 736 and I/O channel 0 738 (which may hereinafter be referred to merely as I/O channels 732, 734, 736 and 738). Although not specifically shown in FIG. 1, each of respective I/O banks 135, 145, 155 and 165 includes a set of I/O channels such as I/O channels 732, 734, 736 and 738 as described with respect to FIG. 7.

In a representative embodiment, apparatus 100 as shown in FIG. 1 includes response data manager 136 that receives four channels of data from I/O bank 135, response data manager 146 that receives four channels of data from I/O bank 145, response data manager 156 that receives four channels of data from I/O bank 155 and response data manager 166 that receives four channels of data from I/O bank 165. As such, each I/O bank 135, 145, 155 and 165 may be characterized as including four I/O channels such as I/O channels 732, 734, 736 and 738 shown in FIG. 7 which may collectively be characterized as a bank of I/O channels. In other representative embodiments, each response data manager may be configured to receive any number of channels from its respective I/O bank.

Response data managers 136, 146, 156 and 166 shown in FIG. 1 are each configured to compare the data (internal data) from respective I/O banks 135, 145, 155 and 165 with expected levels of the data (internal data) to generate comparison results, and to write the comparison results and the tags identifying the comparison results into respective FIFO registers 137, 147, 157 and 167. In more detail with reference to FIG. 7, response data manager 700 takes data from each of its data channels or lanes 432, 434, 436 and 438, compares it with the expected levels provided by the corresponding cyclizer it is connected to, and respectively packs the results of the comparisons together with associated tags into data FIFO register 332 and data tag FIFO register 334. In addition, response data manager 700 performs MatchLoop comparisons in result accumulator 716 and reports the results to the corresponding cyclizer it is connected to. Pipeline delay 712 compensates for data pipeline delays from the cyclizer to the I/O pins of the I/O bank, external driver, buffer, and circuit board routing delays, cable delays to and from DUT 170, data pipeline delays from the I/O pins of the I/O banks to the response data managers, and data pipeline delays through the response data managers, so that compare engines 722, 724, 726 and 728 can be timed to compare the data from each of its data channels or lanes 432, 434, 436 and 438 with the corresponding correct expected levels for that data as provided by the corresponding cyclizer. Response data manager 700 also provides additional programmable delay of up to 256 clocks.

Figure 8:
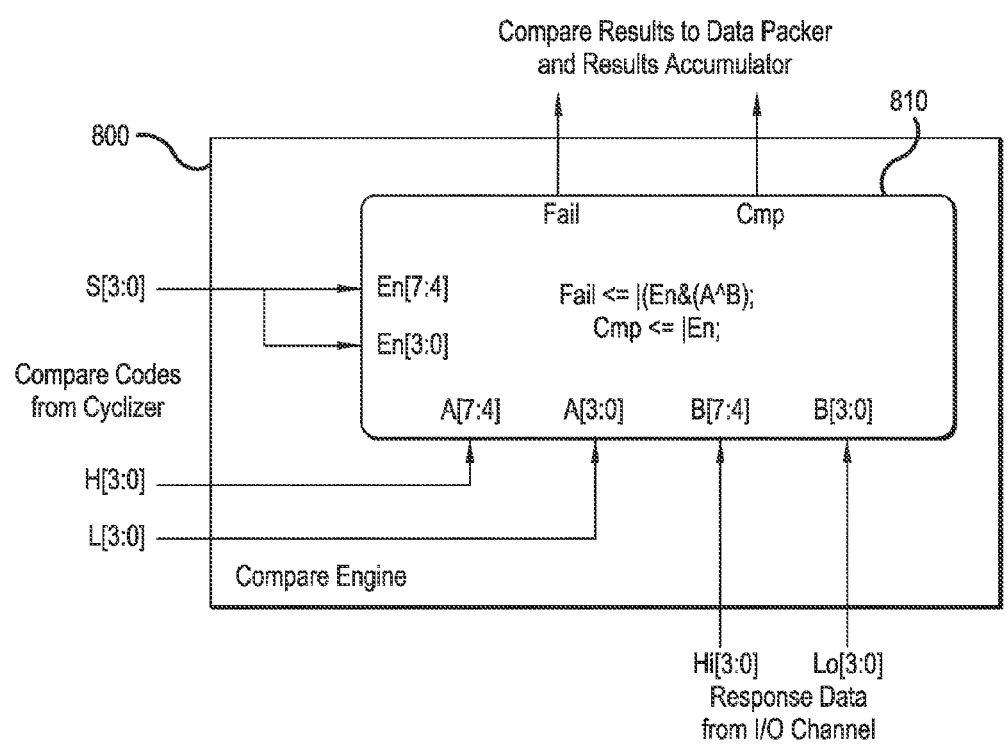
FIG. 8 is a block diagram illustrating a compare engine of a response data manager of the apparatus, according to a representative embodiment.

FIG. 8 is a block diagram illustrating a compare engine of a response data manager of the apparatus, according to a representative embodiment. Compare engine 800 as shown in FIG. 8 may be representative of compare engines 722, 724, 726 and 728 shown in FIG. 7.

Referring to FIG. 8, compare engine 800 performs the data comparison requested by the cyclizer it is connected to, responsive to the compare codes S, H and L provided by the cyclizer through pipeline delay 712. Compare engine 800 includes a logic block 810. The Cmp (short for compare requested) signal output logic block 810 indicates that the cyclizer requested a compare operation for one of the four QDR intervals of the clock period, and thus is a logical OR of the four S (compare strobes) bits. If any of the strobes are asserted, then a comparison is requested. The Fail (short for comparison failed) signal indicates that one of the four possible comparisons in the clock period was a mismatch, and is thus a logical OR of the individual comparisons. Each of the individual comparisons is a logical exclusive-OR (XOR) of the measured data bits versus expected data bits masked by the corresponding compare strobe. In detail, there are two different comparisons done on the user data. That is, the user signal is compared against two different voltage thresholds, a "high" threshold Hi[3:0] and a "low" threshold Lo[3:0]. The user signal might be below the low threshold, between the low and high threshold, or above the high threshold. Thus there are two bits for each signal that are output to the data the result accumulator 716 and the data packer 718 shown in FIG. 7, a compare-high and a compare-low. When a comparison is requested, both the high and the low values are compared.

FIG. 9 is a block diagram illustrating a data packer of a response data manager of the apparatus, according to a representative embodiment. Data packer 900 as shown in FIG. 9 may correspond to data packer 718 shown in FIG. 7.

Referring to FIG. 9, data packer 900 includes control logic 910, data demultiplexer 920 and logic block 930. Control logic 910 is connected to tag counter 714 to receive Count, CycStart, Reset and Rollover signals. Control logic 210 is also connected to data FIFO register 332 to receive Ready0 and Ready1 signals, which indicate that the data FIFO register 332 is ready to accept more data. Of note, if more data was written into data FIFO register 332 prior to data FIFO register 332 being ready to accept more data, an error signal indicated by the "Overflow" signal is output by control logic 910 to status registers to inform the user that data may be lost. Control logic 910 also outputs a Valid signal to data FIFO register 332. Data demultiplexer 920 is connected to receive the comparison results from control logic 910, and to send the comparison results to data FIFO register 332. Moreover, control logic 910 of data packer 900 is also connected to receive LogEv, LogFail and LogCmp signals from logic block 930, and responsive to these signals decides which result data to send to data FIFO register 332. Control logic 910 also outputs comparison result data to multiplexer 920. Logic block 930 is also connected to global trigger management 128 to receive an Event signal E[2:0], to registers to receive a Mask M[2:0] signal and a LogCmp signal, and to the compare engines 722, 724, 726 and 728 to receive the Cmp and Fail results. Control bits may be written into the registers by the host to control the events to be monitored and what conditions cause data to be written into data FIFO register 332.

Logic block 930 of data packer 900 as shown in FIG. 9 takes in the channel comparison results Cmp and Fail, and continually logs the comparison failures Cmp into data FIFO register 332 via control logic 910, according to its programmable operating mode. Logic block 930 will either log the results of all comparisons, or log only the failed comparisons. In either case, logic block 930 logs the results of contiguous 8 cycle segments, with each segment beginning on a multiple of an 8 cycle count. Logic block 930 logs the pass fail status of each channel for each of the cycles within the 8 cycle segment, for any segment that includes any cycle that must be logged, and also logs up to 3 bits of event data associated with each data cycle.

In logic block 930, Data is the concatenation of the E (Event signal) and the F (Fail signal) into an 8 bit wide value. LogEv (log event) is generated by logically ANDing the E (event signal) and the M (mask signal) and then logically ORing those results together. LogFail (log fail) is generated by logically ORing the F (fail signals) together. LogCmp (log compare) is generated by logically ORing the C (compare signals) together, and logically ANDing that result with the LogCmp (LC) signal. LogCmp provides indication of a request by a user to log any results for which a comparison was desired (whether or not the comparison passed or failed). LogFail provides indication of a request by a user to only log results for which a comparison was desired and the comparison failed. LogEv provides indication of a request by a user to log data based on external events (the Event signals).

Figure 10:
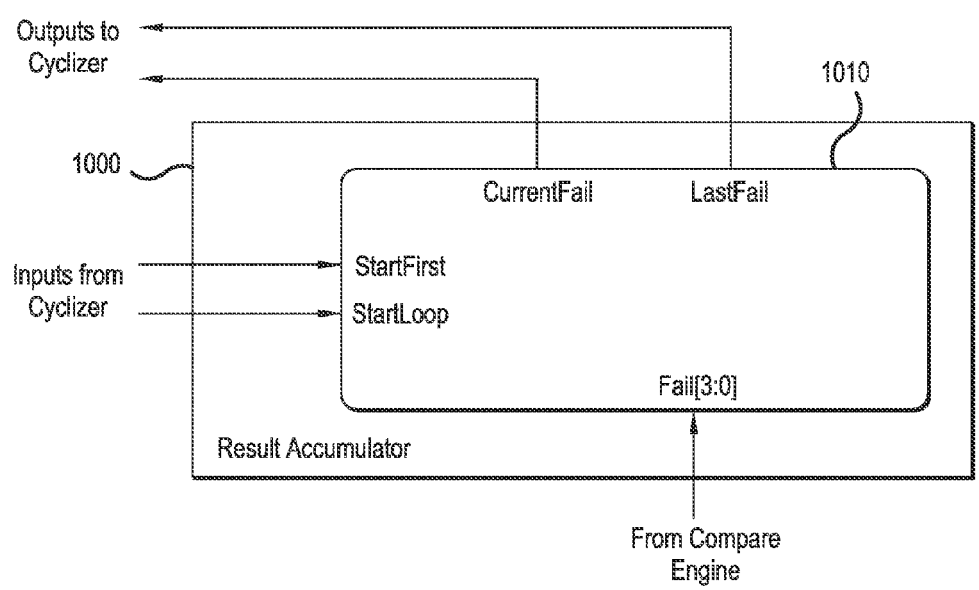
FIG. 10 is a block diagram illustrating a result accumulator of a response data manager of the apparatus, according to a representative embodiment.

FIG. 10 is a block diagram illustrating a result accumulator of a response data manager of the apparatus, according to a representative embodiment. Result accumulator 1000 shown in FIG. 10 may correspond to result accumulator 716 shown in FIG. 7.

Referring to FIG. 10, result accumulator 1000 includes logic block 1010 connected to a corresponding cyclizer such as cyclizer 400 shown in FIG. 4. Logic block 1010 outputs CurrentFail and LastFail signals to the cyclizer and receives MatchLoop control signals from the cyclizer. Logic block 1010 is further connected to comparison engines 722, 724, 726 and 728 so as to receive comparison result Fail. Result accumulator 1000 determines whether all comparisons during a series of cycles pass. In a representative embodiment, synchronous operation of result accumulator 1000 with the result accumulators of the other response data managers is shown in Table 6.

TABLE 6

| StartFirst | StartLoop | CurrentFail | LastFail |
| --- | --- | --- | --- |
| 1 | X | <=\|Fail[3:0] | <=1 |
| 0 | 1 | <=\|Fail[3:0] | <= CurrentFail |
| 0 | 0 | <= CurrentFail\|(\|Fail[3:0]) | |

In more detail, result accumulator 1000 keeps track of whether any comparisons fail during an iteration of a MatchLoop, and provides both a running indication of the results accumulating during the current iteration (CurrentFail), as well as an iteration of the result of the last complete iteration (LastFail), to the cyclizer. The cyclizer's matchloop block (such as MatchLoop Buffer 414 in FIG. 4) may be configured to branch either when the current loop has no comparison failures up to the current vector, or when the last complete iteration has no comparison failures. Result accumulator 1000 is initialized when the StartFirst signal from the cyclizer is asserted to indicate the first vector of the first iteration. In order for the MatchLoop to not prematurely exit at the end of the first iteration, the LastFail signal is initialized to 1 (indicating that the prior loop had a failure comparison). The CurrentFail signal takes on the result of the first comparison in the loop (the OR of the 4 Fail bits). On subsequent clocks in the loop (whether the first loop iteration or subsequent iterations), the CurrentFail signal is updated to reflect the additional comparison results (the OR of its current value and the 4 current Fail bits). At the beginning of each subsequent iteration, the LastFail signal takes on the value of the last CurrentFail (the result of the complete iteration). The CurrentFail signal then takes on the value of the first comparison of the new iteration.

Figure 11:
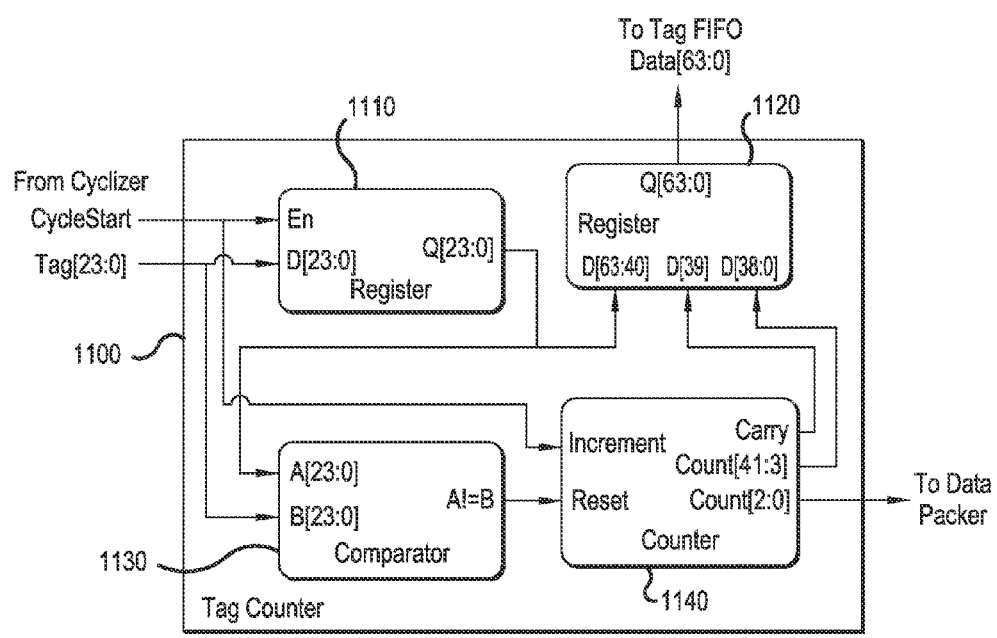
FIG. 11 is a block diagram illustrating a tag counter of a response data manager of the apparatus, according to a representative embodiment.

FIG. 11 is a block diagram illustrating a tag counter of a response data manager of the apparatus, according to a representative embodiment. Tag counter 1100 shown in FIG. 11 may correspond to tag counter 714 shown in FIG. 7.

Referring to FIG. 11, tag counter 1100 includes register 1110 connected to a corresponding cyclizer such as cyclizer 400 shown in FIG. 4. Register 1110 receives CycleStart and Tag signals from the cyclizer. Comparator 1130 of tag counter 1100 is connected to the corresponding cyclizer and register 1110, and receives the CycleStart and Tag signals from the cyclizer and an output from register 1110. Counter 1140 of tag counter 1100 is connected to the cyclizer and comparator 1130, and receives the CycleStart signal from the cyclizer and an output from comparator 1130. Counter 1140 outputs a Count signal to data packer 718 shown in FIG. 7. Register 1120 of tag counter 1100 receives the output from register 1110 and Count and Carry signals output from counter 1140. Register 1120 outputs data Q to the data tag FIFO register (such as data tag FIFO register 334 shown in FIG. 7). Tag counter 1100 counts the number of cycles associated with every data tag provided by the corresponding cyclizer.

In more detail, a complete tag is the concatenation of the 24 bit major tag from the cyclizer and the most significant 39 bits of a 42 bit cycle count. The complete tag also includes an indication that counter 1140 has rolled over. Register 1110 provides a delayed (by one clock) version of the major tag from the cyclizer, and provides this value to comparator 1130. Comparator 1130 block detects when the cyclizer provides a new major tag by comparing the tag values on successive clocks. The result of this comparison resets the cycle count in counter 1140. Counter 1140 is incremented at the start of every cyclizer cycle. The least significant 3 bits of the cycle count are used by data packer 718 (see FIG. 7), which packs the results of 8 cyclizer cycles into each Data FIFO word. These bits are not needed in data tag FIFO register 334 shown in FIG. 7, which stores tags corresponding to the first cycle of each data FIFO word. Register 1120 of tag counter 1100 as shown in FIG. 11 appends the counter carry bit (rollover indicator) from counter 1140 and the upper 39 count bits to the major tag to form the complete tag, and provides this tag to Data Tag FIFO register 334. It takes pipeline delays into account as necessary.

Figure 12:
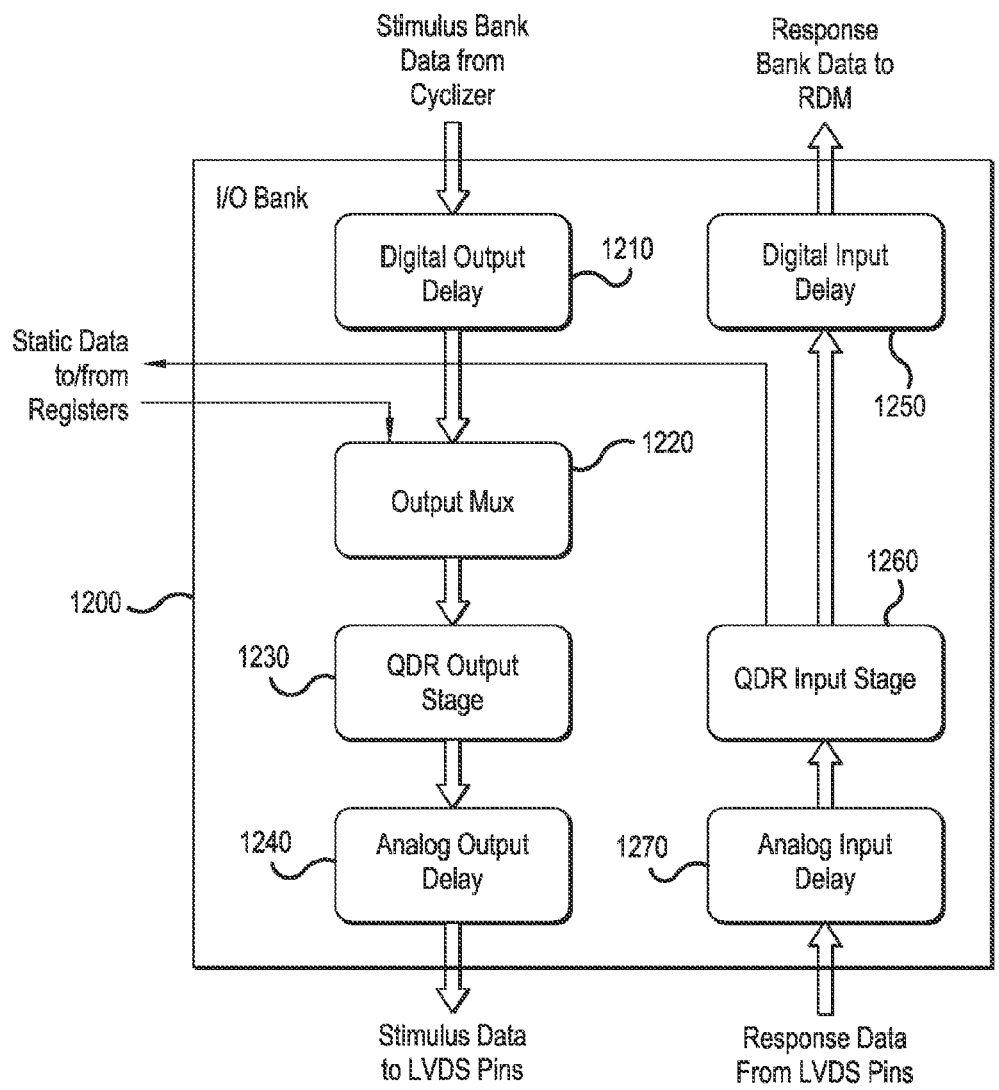
FIG. 12 is a block diagram illustrating an input/output (I/O) bank of the apparatus, according to a representative embodiment.

FIG. 12 is a block diagram illustrating an input/output (I/O) bank of the apparatus, according to a representative embodiment. I/O bank 1200 as shown in FIG. 8 may be representative of I/O banks 135, 145, 155 and 165 shown in FIG. 1.

Referring to FIG. 12, I/O bank 1200 includes a serial connection of digital output delay (digital delay) 1210, output multiplexer 1220, quad data rate (QDR) output stage 1230 and analog output delay 1240 provided along a flow path from a cyclizer such as cyclizer 400 shown in FIG. 4 to DUT 170. As described previously, each cyclizer such as cyclizer 400 shown in FIG. 4 outputs four channels or lanes of data to its corresponding I/O bank. Each cyclizer engine 422, 424, 426 and 428 of cyclizer 400 as shown in FIG. 4 outputs 4-bit data D[3:0] to a corresponding I/O bank as further described with respect to FIG. 5. The four channels of 4-bit data are correspondingly input to digital output delay 1210 of I/O bank 1200 shown in FIG. 12.

I/O bank 1200 as shown in FIG. 12 further includes a serial connection of analog input delay 1270, QDR input stage 1260 and digital input delay 1250 provided along a flow path from DUT 170 to the cyclizer. Digital input delay 1250 outputs four channels or lanes of data to its corresponding response data manager. Each channel outputs 4-bits of Hi[3:0] data and 4-bits of Lo[3:0] data to a compare engine such as compare engines 722, 724, 726 and 728 as shown in FIG. 7 and in more detail in FIG. 8. The Hi[3:0] data signals corresponds to the deserialized data from 4 successive QDR samples of the output of an external high-threshold comparator. The Lo[3:0] data signals originate from a low threshold comparator. I/O bank 1200 thus provides the physical interface between the cyclizer and DUT 170, and provides per channel or lane digital and analog delay capabilities and QDR conversion between the internal 4-bit data streams of the cyclizers and the external 1 bit serial data streams of DUT 170.

In a representative embodiment, digital output delay 1210 of I/O bank 1200 provides the capability to delay the output of a channel or lane from a cyclizer that is to be provided as stimulus data to DUT 170 by up to 255 cyclizer clock integer periods (integer number of clock cycles), plus an additional 0 to 3 output clock (4× cyclizer frequency) integer periods. Digital output delay 1210 consists of two major components including an integer delay that delays the data words an integer number of cyclizer clocks, and a fractional delay that delays the data words 0 to 3 quarter cyclizer clocks (fractions of a clock cycle). The integer delay is a block RAM based element that delays the input by an integer number of clocks. The length of the delay is set by a control register. The delay values possibly vary from 0 to 255 clock cycles. The fractional delay is accomplished by shifting the data bits within and between four bit words. Digital input delay 1250 is configured and operates in a similar manner as digital output delay 1210, except that it operates on incoming data from DUT 170. Output multiplexer 1220 is a multiplexer that switches between the four dynamic data channels or lanes coming from the cyclizer and static data from a control register (not shown) within the I/O bank, based on a control register bit that may be provided by the host.

In a representative embodiment, QDR output stage 1230 as shown in FIG. 12 accepts data from output multiplexer 1220 as 4 bit nibbles once every cyclizer clock, and serializes that data (outputting the least significant bit first) into a data stream at 4 times the cyclizer clock rate. QDR output stage 1230 is implemented by a shallow FIFO that moves the data into the output clock domain of I/O bank 1200 (2 times the cyclizer clock rate), followed by a conversion from a four bit wide stream to a two bit wide stream and then a double data rate (DDR) output buffer. In this implementation, the DDR output buffer of QDR output stage 1230 includes two output buffers, and every channel or lane of I/O bank 1200 drives the two output buffers. The two output buffers include a first buffer and a second buffer that respectively drive the output enable signal E to external I/O buffers between apparatus 100 and DUT 170 and the data levels D provided from the cyclizer (see FIG. 5).

In a representative embodiment, QDR input stage 1260 as shown in FIG. 12 accepts serial data from the response input pins of DUT 170 (through analog input delay 1270) at 4 times the cyclizer clock rate, and deserializes that data into 4 bit nibbles at the cyclizer clock rate. QDR input stage 1260 is implemented by a DDR input buffer clocked at twice the cyclizer clock rate, followed by a conversion from a two bit wide stream to a four bit wide stream and then a shallow FIFO for moving the data into the cyclizer clock domain. In the implementation, the DDR input buffer includes two input buffers, and every channel or lane of I/O bank 1200 receives data through two input buffers. The two input buffers include a first buffer and a second buffer that respectively receive data from a high threshold comparator and a low threshold comparator located in the above noted external I/O buffers between apparatus 100 and DUT 170. The four bit wide data from QDR input stage 1260 is sent to both digital input delay 1250 and a static data read register within the I/O bank.

In a representative embodiment, analog output delay 1240 and analog input delay 1270 may be implemented using resources within the FPGA I/O cell for each buffer, and may provide per channel or lane delay of up to about 1 nanosecond depending on temperature and process variations. In a representative embodiment, analog output delay 1240 may delay the serial data from QDR output stage 1230 by an integer number of analog delay stages. The FPGA I/O cell provides programmable delay elements in every I/O cell, both for inputs and outputs. These are typically used by the FPGA design tools to adjust the input and output timing of signals to account for propagation delays with in the FPGA, for example. For that use, the delays are fixed when the FPGA is designed. Alternately, these delays can be made variable during normal use of the FPGA. There is provided the ability to use one of sixty four different delay values with a maximum delay about one nanosecond. These delays are used to provide small shifts in signal timing.

In a representative embodiment, data transfer banks 130, 140, 150 and 160 as shown in FIG. 1 are configurable to be operable in a first mode to output stimulus data to DUT 170 as respective independent banks of serial stimulus data channels, and to write response data into memory 126 responsive to data provided as respective independent banks of channels of serial data from DUT 170. In a second mode, data transfer banks 130, 140, 150 and 160 are configurable to be operable to output stimulus data to DUT 170 as a single combined bank of serial stimulus data channels, and to write response data into memory 126 responsive to data provided as a combined single bank of channels of serial data from DUT 170. Accordingly, the aforementioned stimulus banks within data transfer banks 130, 140, 150 and 160, which each include a stimulus data sequencer, a FIFO register, a cyclizer and an I/O bank, are configured to be operable in a first mode to output stimulus data to DUT 170 as respective independent banks of serial stimulus data channels, and in a second mode to output stimulus data to DUT 170 as a single combined bank of serial stimulus data channels. Likewise, the aforementioned response banks within data transfer banks 130, 140, 150 and 160, which each include an I/O bank, a response data manager, a FIFO register and a response data sequencer, are configured to be operable in a first mode to write the response data into memory 126 responsive to data provided as respective independent banks of channels of serial data from DUT 170, and in a second mode to write response data into memory 126 responsive to data provided as a combined single bank of channels of serial data from DUT 170.

When a data transfer bank such as data transfer bank 130 in FIG. 1 begins to operate, stimulus data sequencer 132 fills FIFO register 133 with waveform segments read from memory 126. Cyclizer 134 waits until FIFO register 133 buffers up enough data of the waveform segments to begin outputting continuous data to cyclizer 134. Once continuous data flow begins from FIFO register 133, cyclizer 134 may begin managing the received data (waveform segments) provided from FIFO register 133 to form waveform patterns which are correspondingly output to I/O bank 135 which in turn converts the waveform patterns into serial data and outputs the serial data as stimulus data to DUT 170. In a first mode of operation, data transfer banks 140, 150 and 160 operate in a similar manner, to output respective independent serial stimulus data channels, asynchronously with respect to each other, to DUT 170.

In a second mode of operation, data transfer banks 130, 140, 150 and 160 may all operate in a single 16 channel mode so as to output stimulus data as a single combined bank of serial stimulus data channels, where the respective serial stimulus data channels output from I/O banks 135, 145, 155 and 165 are synchronized with respect to each other. Cyclizers 134, 144, 154 and 164 within data transfer banks 130, 140, 150 and 160 wait until respective FIFO registers 137, 147, 157 and 167 begin to output continuous data, and responsive to receipt of continuous data cyclizers 134, 144, 154 and 164 output a flag to global trigger management 128 indicative that they are ready to output waveform patterns to respective I/O banks 135, 145, 155 and 165. Upon receipt of the flags from all of cyclizers 134, 144, 154 and 164, global trigger management 128 sends a signal instructing cyclizers 134, 144, 154 and 164 to begin outputting the waveform patterns to respective I/O banks 135, 145, 155 and 165, which subsequently convert the waveform patterns into serial data which output synchronously as a single combined bank of serial stimulus data channels.

In a representative embodiment, the aforementioned response banks are slaved to their respective aforementioned stimulus banks. When the stimulus banks operate in the second mode, the response banks all operate in the second mode as well. The response banks may be slaved to the stimulus banks as follows. Responsive to software control register write instructions, the stimulus data sequencers 132, 142, 152 and 162 and the response data sequencers 138, 148, 158 and 168 as shown in FIG. 1 are started, and then the cyclizers 134, 144, 154 and 164 are subsequently started. As each cyclizer detects that its corresponding stimulus data sequencer has provided enough data for the cyclizer to begin outputting data, the cyclizer arms itself to receive a start trigger. The trigger may be an immediate trigger (automatic self trigger) or may come from global trigger management 128. For example, when a cyclizer such as cyclizer 134 in data transfer bank 130 receives its start trigger, it begins outputting data, and also begins sending compare codes and data tags to its corresponding response data manager 136. These signals from cyclizer 134 cause response data manager 136 to begin logging comparison results into its corresponding FIFO register 137, and the comparison results are then moved from FIFO register 137 by corresponding response data sequencer 138 to memory 126. Data transfer banks 140, 150 and 160 operate in a similar manner. Thus, when the cyclizers are started together in the second mode, the response data managers also operate synchronously with respect to each other, and data transfer banks 130, 140, 150 and 160 operate as a single bank.

As described previously, each of FIFO registers 133, 143, 153 and 163 shown in FIG. 1 may include a branch trigger FIFO register such as branch trigger FIFO register 230 shown in FIG. 2. In a representative embodiment, branch trigger FIFO register 230 functions as a feedback path from a corresponding cyclizer. For example, branch trigger FIFO register 230 shown in FIG. 2 may be configured to receive notice from matchloop buffer 414 of cyclizer 400 as shown in FIG. 4 that cyclizer 400 has branched out of a vector loop. The notice may be in the form of a symbol of one or more bits, and is output from branch trigger FIFO register 230 to sequencer engine 214 shown in FIG. 2. Responsive to receipt of the notice, sequencer engine 214 may fetch instructions from the sequencer programming stored in memory 126 to enter a newly active branch.

In more detail, as previously described with respect to FIG. 4, cyclizer 400 includes matchloop buffer A 414 and matchloop buffer B 415 (which may hereinafter be referred to merely as matchloop buffers 414 and 415) respectively connected to data FIFO register A 232 and data FIFO register B 234 (which may hereinafter be referred to merely as data FIFO registers 232 and 234). In addition to the vector data, in a representative embodiment the data FIFO registers 232 and 234 may also carry data Tags and other sideband information. Along with every waveform vector word that a stimulus data sequencer moves to a data FIFO register, the stimulus data sequencer may append the following sideband information: a NewTag bit to indicate that a new data tag is present (Tag_segment); a 24 bit DataTag field, valid when NewTag is "1" (Tag_segment); a StartTableWrite bit to indicate the beginning of a table write operation (Load_Table); a StartLoop bit to indicate the beginning of a short wait loop (Short_wait_loop); a 9 bit WaitLoopCount (if StartLoop is "1") or TableNumber (if StartTableWrite is "1"); a 32 bit WaitLoopTimeOut (if StartLoop is "1") or TableWordCount (if StartTableWrite is "1"); a 6 bit WaitLoopFlags field (valid if StartLoop is "1"); and a LastVector bit to indicate that the word contains the last vector in the pattern.

As the matchloop buffers 414 and 415 remove data from the corresponding data FIFO registers 232 and 234, they may use the sideband information to operate as follows: if the NewTag bit is "1", the matchloop buffer will use the data in the DataTag field as the Data Tag to the corresponding response data manager for the current and subsequent vectors; if the StartTableWrite bit is "1", the matchloop buffer will write the next TableWordCount 32-bit word into the waveform table designated by TableNumber; if the StartLoop bit is "1", the matchloop buffer will treat the next WaitLoopCount vectors as a short wait loop, repeating the vectors for a maximum of WaitLoopTimeout iterations while waiting for the exit condition indicated by WaitLoopFlags; and if the LastVector bit is "1", the matchloop buffer will cause the cyclizer to exit its run state when the indicated vector is processed.

To support the above noted operations, a stimulus data sequencer such as stimulus data sequencer 200 shown in FIG. 2 may implement the following branching constructs for a long wait loop.

Start_long_wait_loop (timeout, flags, next_instruction): This instruction causes the stimulus data sequencer and the cyclizer to treat the enclosed vectors as a long wait loop. The Start_long_wait_loop instruction indicates that the first vector of the subsequent Read_Segment instruction is the beginning of a long wait loop. The stimulus data sequencer passes the flags parameter to the cyclizer.

End_long_wait_loop: This instruction indicates that the last vector of the subsequent Read_Segment instruction is the end of a long wait loop. The stimulus data sequencer will repetitively execute all instructions in the loop for up to timeout passes, beginning with the first Read_segment instruction after the Start_long_wait_loop instruction and ending with the first Read_Segment instruction after the End_long_wait_loop instruction. Meanwhile, the cyclizer will monitor its trigger inputs for the termination condition specified by the flags parameter. If this condition is satisfied during any pass through the loop vectors, the stimulus data sequencer and the cyclizer will begin processing an alternate set of vectors, some of which will have been speculatively loaded into one of data FIFO registers 232 and 234 as an alternate data FIFO register, followed by vectors fetched by instructions beginning at the address specified by the next_instruction parameter.

In more detail, during a long wait loop, a matchloop buffer will monitor its trigger inputs for the termination condition specified by the flags parameter. If this condition is satisfied during any pass through the loop vectors, the matchloop buffer will initiate a branch. This branch will occur at the end of a loop iteration, at which time the cyclizer will begin processing vectors from the alternate data FIFO register (that is one of data FIFO registers 232 and 234). The matchloop buffer will also send an indication through a branch trigger FIFO register (such as branch trigger FIFO register 230 shown in FIG. 2) to the stimulus data sequencer that it has executed the branch.

In the sequencer programming fetched from memory 126 by sequencer engine 214 of stimulus data sequencer 200 such as shown in FIG. 2, the Start_long_wait_loop instruction must be preceded by one or more Read_segment instructions that speculatively fill the alternate data FIFO register with vector words from waveform segments in memory. These are the vectors that are immediately processed by the cyclizer after the branch. Once the cyclizer has executed the branch, the stimulus data sequencer will receive the indication from the branch trigger FIFO register that the cyclizer has branched. At this time, the stimulus data sequencer stops executing the instructions within the long wait loop, and begins executing the instructions starting at the specified next_instruction address. The stimulus data sequencer also switches the roles of the data FIFO registers 232 and 234, so that the previously active data FIFO register among the data FIFO registers 232 and 234 becomes the alternate data FIFO register and the previously alternate data FIFO register becomes the active data FIFO register. It should be understood that in this context, an "active" data FIFO register refers to either of data FIFO registers 232 and 234 and its associated data mover (data mover A 216 and data mover B 220 shown in FIG. 2) and the matchloop buffer that is currently providing vectors to the cyclizer. The "alternate" data FIFO register is either idle or accumulating speculative vectors for a possible future branch.

The phrase "and/or," as used herein in the specification and in the claims, should be understood to mean "either or both" of the elements so conjoined. In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. An apparatus for moving complex waveforms from a memory to a device under test (DUT), the apparatus comprising:
   a plurality of stimulus banks, each of the stimulus banks comprising
   a stimulus data sequencer configured to successively read waveform segments of the complex waveforms stored in the memory and write the waveform segments into a FIFO register responsive to instructions fetched from the memory;

a cyclizer configured to manage the waveform segments from the FIFO register to form waveform patterns responsive to symbols embedded within the waveform segments; and an input/output (I/O) bank configured to convert the waveform patterns into serial data, and output the serial data as stimulus data, wherein the stimulus banks are configured to output the stimulus data from the I/O banks to the DUT in a first mode as respective independent banks of serial stimulus data channels, and in a second mode as a single combined bank of serial stimulus data channels.

2. The apparatus of claim 1, wherein the plurality of stimulus banks are constructed in a single field programmable gate array (FPGA).

3. The apparatus of claim 1, wherein the FIFO register is configured to smooth out data flow rate between the stimulus data sequencer and the cyclizer.

4. The apparatus of claim 1, wherein the stimulus data sequencer comprises a sequencer engine configured to dynamically select the waveform segments from the memory.

5. The apparatus of claim 4, wherein the cyclizer is configured to manage portions of the waveform segments into vector loops and to branch out of the vector loops responsive to user input or sensed DUT conditions.

6. The apparatus of claim 5, wherein the cyclizer comprises a matchloop buffer configured to buffer a plurality of vectors executable in a vector loop prior to receipt of a trigger event that signals branching out of a vector loop.

7. The apparatus of claim 6, wherein the cyclizer further comprises a cyclizer trigger manager configured to generate and control routing of trigger events within the cyclizer.

8. The apparatus of claim 5, further comprising a feedback path from the cyclizer configured to inform the sequencer engine that a waveform pattern has branched out of a vector loop, wherein the sequencer engine is further configured to fetch instructions from the memory for a newly active branch.

9. The apparatus of claim 5, further comprising a data FIFO register configured to speculatively store post-branch vectors for branching by the cyclizer.

10. The apparatus of claim 4, wherein the DUT generates data responsive to the stimulus data, the stimulus data sequencer further comprising a tag inserter configured to mark waveform segments responsive to the instructions fetched by the sequencer engine, to correlate the response data to respective waveform segments of the stimulus data.

11. The apparatus of claim 5, wherein the cyclizer is further configured to replay a last vector continuously at an end of a waveform pattern.

12. The apparatus of claim 1, wherein the I/O bank comprises a digital delay configured to delay the serial data by an integer number of clock cycles and by fractions of a clock cycle, and an analog delay configured to delay the serial data by an integer number of analog delay stages.

13. The apparatus of claim 1, wherein the stimulus data sequencer comprises:

a sequencer engine configured to translate the instructions fetched from the memory into data movement instructions;

a data mover configured to read the waveform segments from the memory and write the waveform segments into the FIFO register responsive to the data movement instructions; and a tag inserter configured to append data tags and last word markers to each data word of a waveform segment written into the FIFO register.

14. An apparatus for moving data generated by a device under test (DUT) responsive to stimulus data to a memory, the apparatus comprising:

a plurality of response banks, each of the response banks comprising an I/O bank configured to deserialize data generated by the DUT into internal data;

a response data manager configured to compare the internal data from the I/O bank with expected levels of the internal data to generate comparison results, and write the comparison results and tags identifying the comparison results into a FIFO register; and a response data sequencer configured to write the comparison results and the tags from the FIFO register into the memory as response data of the DUT, responsive to instructions fetched from the memory, wherein the response banks are configured to write the response data into the memory in a first mode responsive to the data provided as respective independent banks of channels of serial data from the DUT, and in a second mode responsive to the data provided as a combined single bank of channels of serial data from the DUT.

15. The apparatus of claim 14, wherein the plurality of response banks are constructed in a single field programmable gate array (FPGA).

16. The apparatus of claim 14, wherein the FIFO register is configured to smooth out data flow rate between the response data manager and the response data sequencer.

17. The apparatus of claim 14, wherein the I/O bank comprises a digital delay configured to delay the data generated by the DUT by an integer number of clock cycles and by fractions of a clock cycle, and an analog delay configured to delay the data generated by the DUT by an integer number of analog delay stages.

18. An apparatus for moving stimulus data and response data between a memory and a device under test (DUT), the apparatus comprising:

a plurality of data transfer banks, each of the data transfer banks comprising a stimulus data sequencer configured to successively read waveform segments of complex waveforms stored in the memory and write the waveform segments into a first FIFO register responsive to instructions fetched from the memory;

a cyclizer configured to manage the waveform segments from the first FIFO register to form waveform patterns responsive to symbols embedded within the waveform segments;

an input/output (I/O) bank configured to convert the waveform patterns into serial data, to output the serial data as stimulus data, and to deserialize data generated by the DUT into internal data;

a response data manager configured to compare the internal data from the I/O bank with expected levels of the internal data provided from the cyclizer to generate comparison results, and write the comparison results and tags identifying the comparison results into a second FIFO register; and a response data sequencer configured to write the comparison results and the tags from the second FIFO register into the memory as response data of the DUT, responsive to instructions fetched from the memory.

19. The apparatus of claim 18, wherein the data transfer banks are configured to be operable in
- a first mode to output the stimulus data to the DUT as respective independent banks of serial stimulus data channels, and to write the response data into the memory responsive to the data provided as respective independent banks of channels of serial data from the DUT, and
- a second mode to output the stimulus data to the DUT as a single bank of combined serial stimulus data channels, and to write the response data into the memory responsive to the data provided as a combined single bank of channels of serial data from the DUT.

20. The apparatus of claim 18, wherein all of the data transfer banks are constructed in a single field programmable gate array (FPGA).

21. The apparatus of claim 18, wherein the first FIFO register is configured to smooth out data flow between the stimulus data sequencer and the cyclizer, and the second FIFO register is configured to smooth out data flow between the response data manager and the response data sequencer.

* * * * *